United States Patent
Kobayashi et al.

(10) Patent No.: US 10,477,746 B2
(45) Date of Patent: Nov. 12, 2019

(54) COMPONENT MOUNTING SYSTEM

(71) Applicant: PANASONIC INTELLECTUAL PROPERTY MANAGEMENT CO., LTD., Osaka-shi, Osaka (JP)

(72) Inventors: Hiroki Kobayashi, Yamanashi (JP); Chikara Takata, Yamanashi (JP); Yasuo Takanami, Yamanashi (JP); Shuzo Yagi, Yamanashi (JP); Tetsushi Oohori, Yamanashi (JP); Yoshiaki Awata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/441,446

(22) Filed: Feb. 24, 2017

(65) Prior Publication Data

US 2017/0354070 A1    Dec. 7, 2017

Related U.S. Application Data

(63) Continuation of application No. PCT/JP2016/003859, filed on Aug. 24, 2016.

(30) Foreign Application Priority Data

Jun. 1, 2016    (JP) .................................. 2016-109775

(51) Int. Cl.
*H05K 13/02* (2006.01)
*H05K 13/04* (2006.01)
*H05K 13/08* (2006.01)

(52) U.S. Cl.
CPC ....... *H05K 13/021* (2013.01); *H05K 13/0417* (2013.01); *H05K 13/0419* (2018.08); *H05K 13/086* (2018.08)

(58) Field of Classification Search
None
See application file for complete search history.

(56) References Cited

U.S. PATENT DOCUMENTS

| 5,319,846 A | 6/1994 | Takahashi et al. | |
|---|---|---|---|
| 5,657,709 A * | 8/1997 | Miyachi ............... | D05B 35/068 112/282 |

(Continued)

FOREIGN PATENT DOCUMENTS

| EP | 2874480 A1 * | 5/2015 | ............. H05K 13/08 |
|---|---|---|---|
| EP | 2874481 A1 | 5/2015 | |

(Continued)

OTHER PUBLICATIONS

International Search Report and Written Opinion issued in Patent Application No. PCT/JP2016/003859 dated Nov. 29, 2016.

(Continued)

*Primary Examiner* — Brian W Wathen
*Assistant Examiner* — Hung H Dang
(74) *Attorney, Agent, or Firm* — Pearne & Gordon LLP

(57) ABSTRACT

A component mounting system includes a component mounter that mounts a component in a board, a tape feeder (component feeder) that is placed in the component mounter and supplies the component, and a mobile component supply device that holds a tape cassette (container) storing a component, automatically moves, and supplies the component in the tape cassette (container) to the tape feeder (component feeder).

22 Claims, 27 Drawing Sheets

(56) References Cited

U.S. PATENT DOCUMENTS

| | | | | |
|---|---|---|---|---|
| 2003/0116934 A1* | 6/2003 | Endo | ............... | H05K 13/0417 |
| | | | | 280/47.35 |
| 2003/0219330 A1* | 11/2003 | Lyndaker | ........... | H05K 13/0417 |
| | | | | 414/411 |
| 2006/0200264 A1 | 9/2006 | Kodama et al. | | |
| 2013/0047427 A1* | 2/2013 | Yagi | ............... | H05K 13/0434 |
| | | | | 29/832 |
| 2017/0303448 A1* | 10/2017 | Iisaka | ............... | H05K 13/0069 |
| 2018/0376635 A1* | 12/2018 | Iisaka | ............... | H05K 13/0452 |

FOREIGN PATENT DOCUMENTS

| | | |
|---|---|---|
| JP | 2005-539370 A | 12/2005 |
| JP | 4491418 B2 | 6/2010 |
| WO | 2013-136423 A1 | 8/2015 |
| WO | 2014-010083 A1 | 6/2016 |

OTHER PUBLICATIONS

The Extended European Search Report dated May 6, 2019 for the related European Patent Application No. 16837969.1.

* cited by examiner

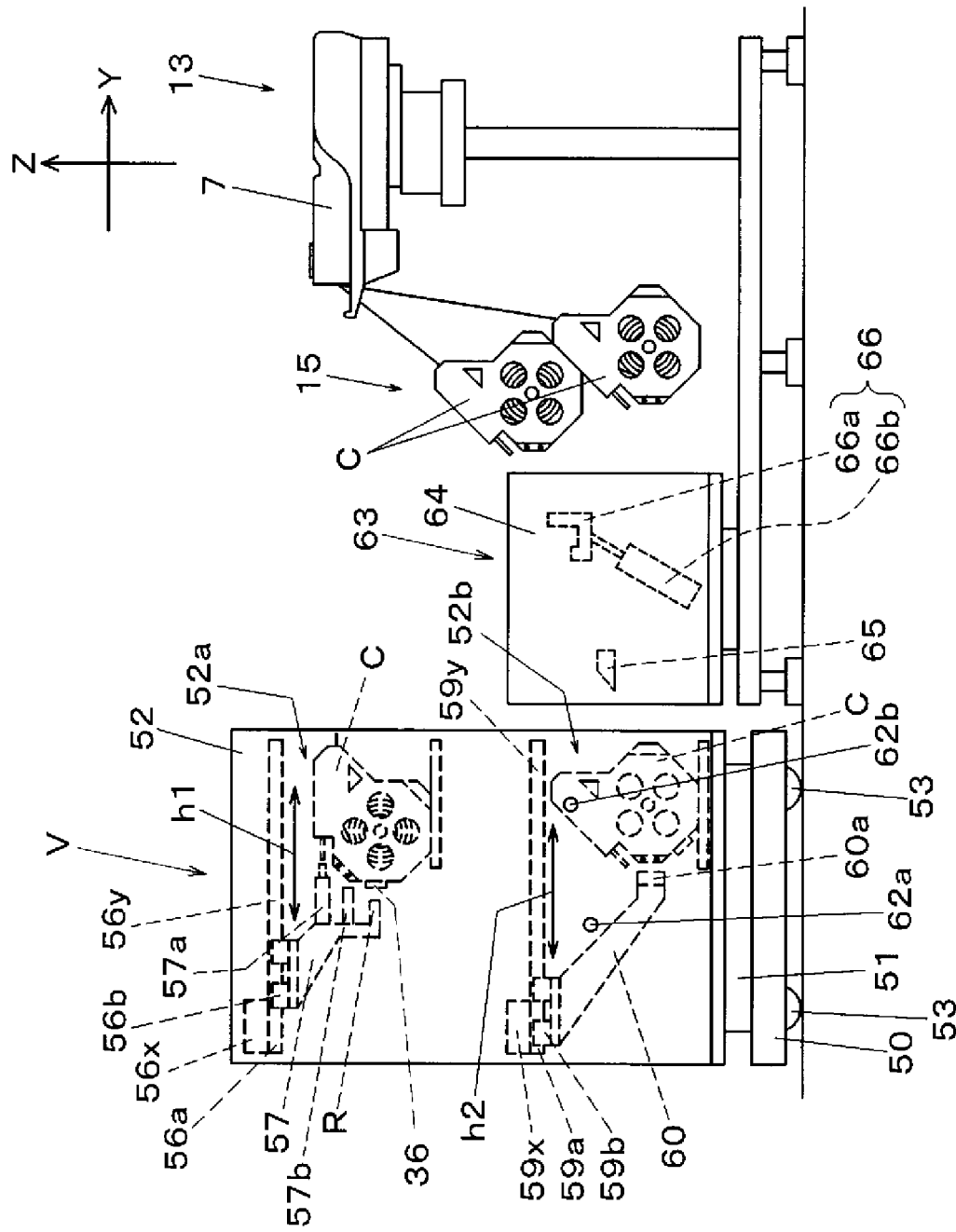

COMPONENT MOUNTING SYSTEM

TECHNICAL FIELD

The present invention relates to a component mounting system automatically supplying a component to a component mounter.

BACKGROUND ART

A component mounting system mounting a component in a board has a configuration in which a plurality of component mounters are coupled together, and a plurality of component feeders such as tape feeders are placed in each of the component mounters. Generally, in a process of continuously executing component mounting work, in a case where components stored in the component feeder are out of stock, a worker managing flue component mounter performs work for supplying and replacing the components. There are many cases where the worker performs work while having multiple component mounters as targets. Therefore, various types of countermeasures aiming to reduce a work load are adopted.

For example, as a management device managing the component mounters, there is a known management device having a function of instructing a worker to pick up components from a component stockroom (component storage) and to replace the components to be supplied to the component mounters in a case where there are components run out of stock or components nearly run out of stock (for example, refer to PTL 1). In the related art, according to a technology disclosed in PTL 1, a board-related work system including a plurality of work mechanisms perforating board-related work, every time assisting work such as component replacing work is required, the assisting work is allocated to any one of a plurality of the workers.

CITATION LIST

Patent Literature

PTL 1: Japanese Patent No. 4491418

SUMMARY OF THE INVENTION

The present invention aims to provide a component mounting system in which work of a worker in component replacing work can be reduced.

The component mounting system of the present invention includes a component mounter that mounts a component in a board, a component feeder that is placed in the component mounter and supplies the component, and a mobile component supply device that holds a container storing a plurality of the components, automatically moves, and supplies the components in the container to the component feeder.

According to the present invention, the work of a worker in the component replacing work can be reduced.

BRIEF DESCRIPTION OF DRAWINGS

FIG. 10 is a view describing a configuration of a mobile component supply device and a coupler included in the component mounting system of the embodiment of the present invention.

DESCRIPTION OF EMBODIMENT

Before an embodiment of the present invention is described, a problem in a system in the related art will be simply described. In technologies in the related art including PTL 1, most of component replacing work is executed by a worker, thereby leading to a problem in that many skilled workers who can execute the component replacing work are required.

Figure 1:
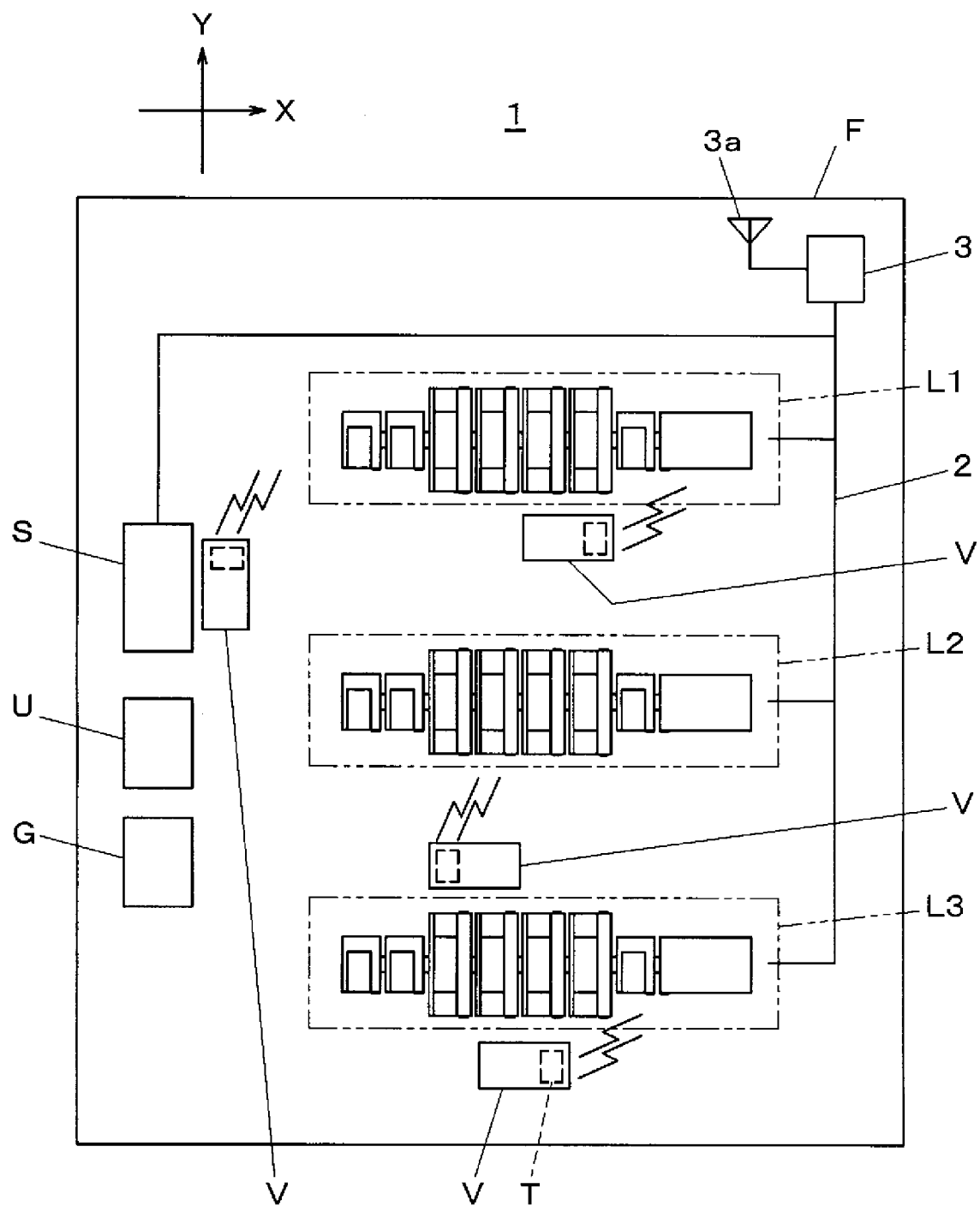
FIG. 1 is a view describing a configuration of a component mounting system of an embodiment of the present invention.
Figure 4:
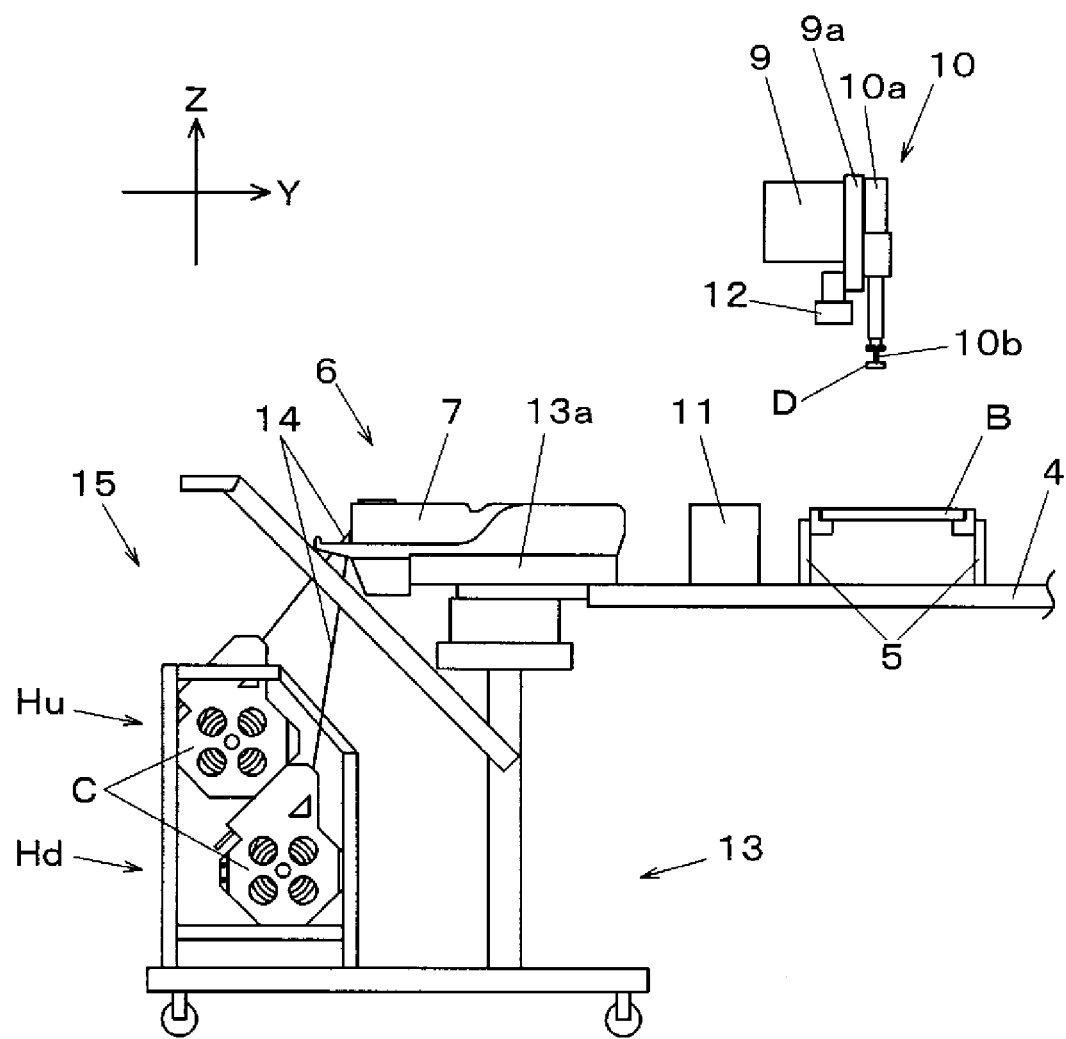
FIG. 4 is a partial sectional view of the component mounter included in the component mounting system of the embodiment of the present invention.

Hereinafter, by using the drawings, the embodiment of the present invention will be described in detail. Configurations, shapes, and the like mentioned below are examples for description. In accordance with specifications of a component mounting system, a component mounting line, and a mobile component supply device, suitable changes can be made. Hereinafter, the same reference marks are applied to corresponding elements in all of the drawings, and overlapping description will be omitted. In FIG. 1 and some parts described below, as a biaxial direction orthogonal to each other within a horizontal plane, an X-direction (transverse direction in FIG. 1) which is a board transport direction, and a Y-direction (vertical direction in FIG. 1) orthogonal to the board transport direction are illustrated. In FIG. 4 and some parts described below, as a height direction orthogonal to the horizontal plane, a Z-direction (vertical direction in FIG. 4) is illustrated. The Z-direction is the vertical direction or an orthogonal direction in a case where a component mounter is installed on the horizontal plane.

First, with reference to FIG. 1, the configuration of component mounting system 1 will be described. Component mounting system 1 has a configuration in which three component mounting lines L1 to L3 provided on floor F, component storing device S, and management computer 3 are connected together through communication network 2. As described below, each of component mounting lines L1 to L3 has a configuration in which a plurality of component mounting related devices including the component mounter are coupled together, and each thereof has a function of producing a mounting board by mounting a component in a board. Component mounting system 1 does not necessarily include three component mounting lines L1 and may include one, two, four, or more thereof.

Component storing device S receives plurality of tape cassettes C (refer to FIGS. 6A and 6B) in each of which a carrier tape (described below) is wound and stored, stores tape cassettes C in a storing shelf provided inside thereof, and picks up predetermined tape cassette C from the storing shelf inside thereof in response to an instruction front management computer 3. That is, component storing device S is a component storage storing tape cassettes C (containers). On floor F, used cassette collecting device U and tape waste discarder G are provided. Moreover, on floor F mobile component supply devices V (here, four) are disposed. Wireless communicator T is built in mobile component supply device V, which transmits and receives a signal and information to and from management computer via a wireless communicator 3a included in management computer 3.

Mobile component supply device V moves autonomously between predetermined positions on floor F based on an instruction from management computer 3, and information directly gathered by using a beacon (illustration omitted) installed on floor F, various types of sensors (GPS, obstacle sensor, and the like) built in mobile component supply device V, a camera or the like. Here, a receiver receives radio waves of a plurality of the beacons installed on floor F, and beacons respectively provided in mobile component supply devices V. A position calculator (illustration omitted) calculating a position of mobile component supply device V based on radio wave information received by the receiver functions as a position detector detecting the position of mobile component supply device V within floor F.

The position detector may be configured with the position calculator (illustration omitted) calculating the position of mobile component supply device V based on a GPS provided in each of mobile component supply devices V and positional information of the GPS. In addition, mobile component supply device V holds plurality of supply tape cassettes C picked up from component storing device S and supplies tape cassettes C to the component mounters in component mounting lines L1 to L3. Moreover, mobile component supply device V collects empty tape cassette C and returns empty tape cassette C to used cassette collecting device U. In addition, mobile component supply device V collects tape waste from the component mounter and discards the tape waste in tape waste discarder G.

Figure 2:
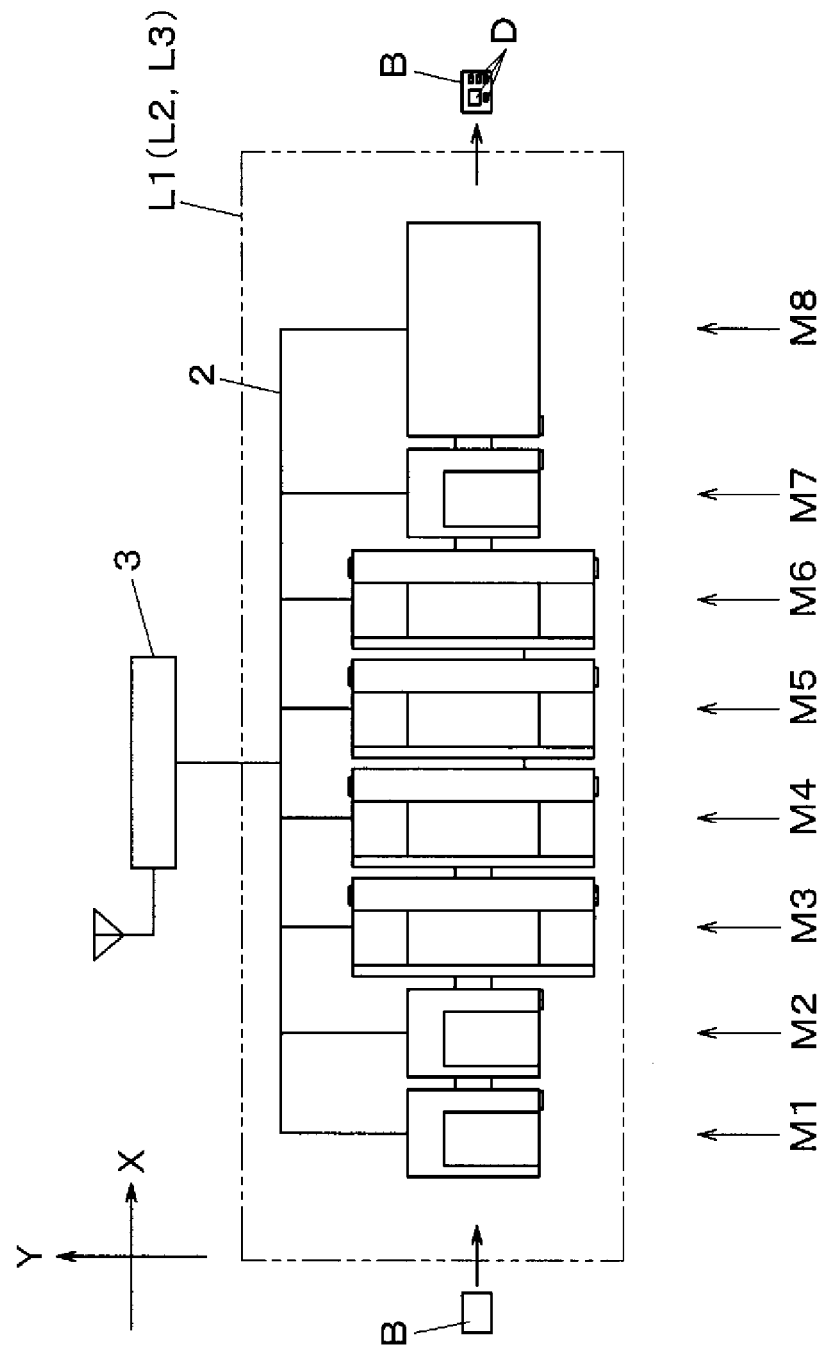
FIG. 2 is a view describing a configuration of component mounting lines included in the component mounting system of the embodiment of the present invention.

Next, with reference to FIG. 2, the detailed configuration of component mounting lines L1 to L3 will be described. Component mounting lines L1 to L3 have configurations similar to each other. Hereinafter, component mounting line L1 will be described. Component mounting line L1 has a configuration in which solder print device M1, print inspection device M2, component mounters M3 to M6, mounting inspection device M7, and reflow device M8 are coupled together in series from an upstream side (left side on the sheet) toward a downstream side (right side on the sheet) in the board transport direction (X-direction).

Solder print device M1, print inspection device M2, component mounters M3 to M6 mounting inspection device M7, and reflow device M8 are connected to management computer 3 via communication network 2. Solder print device M1 executes solder print work in which a solder prior worker prints solder in board B carried in from the upstream side. Print inspection device M2 executes print inspection work in which a print inspection worker including a solder inspection camera inspects a state of the solder printed in board B.

Component mounters M3 to M6 execute component mounting work in which a component mounting worker mounts component D in board B. Component mounting line L1 is not limited to the configuration having four component mounters M3 to M6. There may be one to three, five, or more component mounters M3 to M6. Mounting inspection device M7 executes mounting inspection work in which a mounting inspection worker including a component inspection camera inspects a state of component D placed in board B. Reflow device M8 executes board heating work in which a board heater heats board B carried into the device, the solder on board B is hardened, and an electrode of board B and component D are bonded together.

Next, with reference to FIGS. 3 and 4, the configurations of component mounters M3 to M6 will be described. Component mounters M3 to M6 have configurations similar to each other. Here, component mounter M3 will be described. FIG. 4 partially illustrates a section taken along A-A in FIG. 3. Component mounter M3 has a function of mounting component D in board B.

Figure 3:
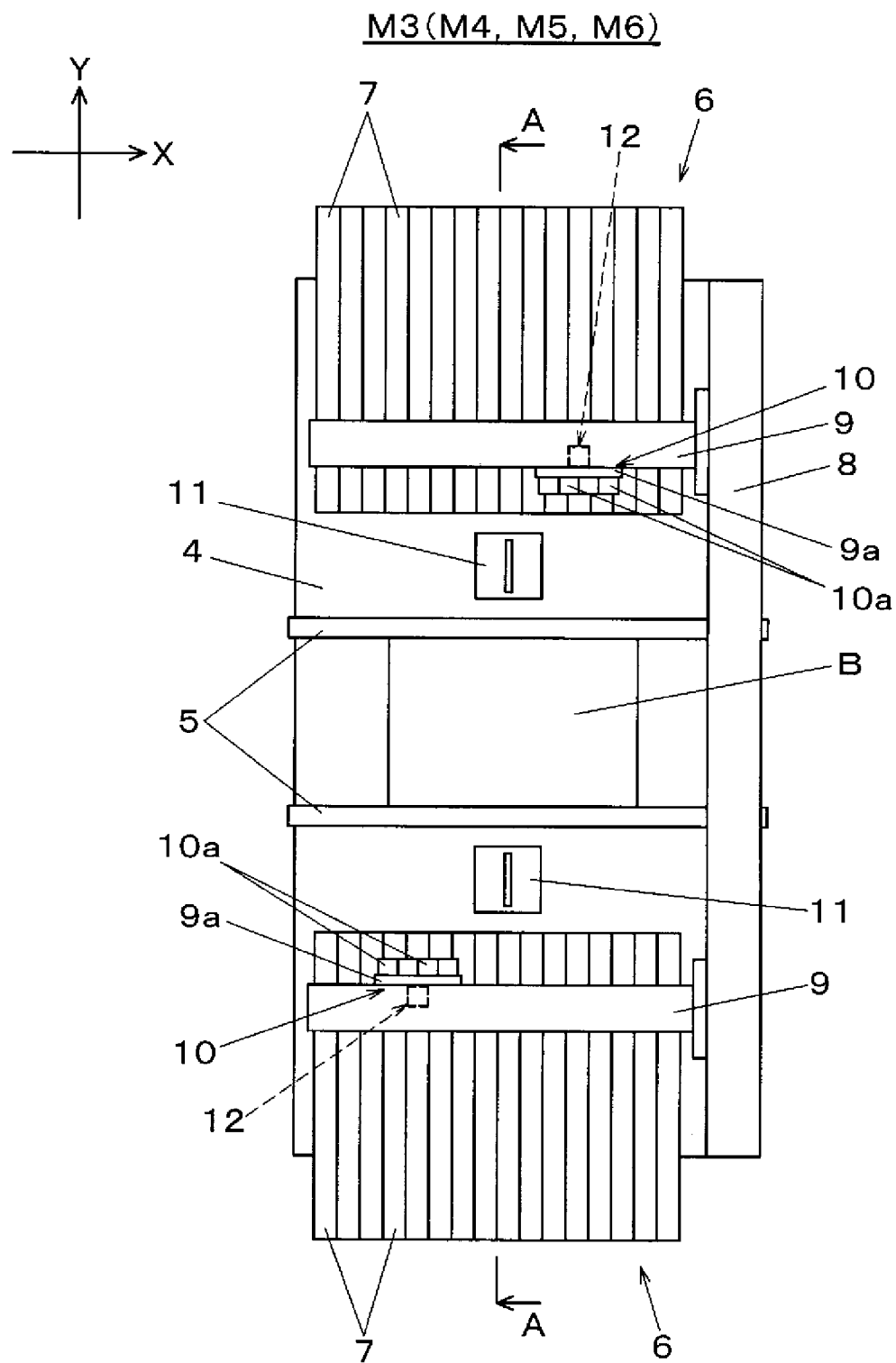
FIG. 3 is a plan view of a component mounter included in the component mounting system of the embodiment of the present invention.

In FIG. 3, board transport mechanism 5 is provided in the middle of base 4 in the X-direction. Board transport mechanism 5 transports board B carried in from the upstream side, and positions and holds board B at a position for executing the component mounting work. On both sides of board transport mechanism 5, component suppliers 6 are disposed. In each of component suppliers 6, plurality of tape feeders 7 are disposed in parallel in the X-direction. Tape feeder 7 pitch-feeds the carrier tape storing component D in a tape feed direction, and supplies component D to a component pick-up position where a mounting head of a component mounting mechanism (described below) picks up the component. That is, tape feeder 7 configures a component feeder which is placed in component mounter M3 and supplies component D.

In the end on one side in the X-direction on the top surface of base 4, Y-axis beam 8 having a linear drive mechanism is provided along the Y-direction. Two X-axis beams 9 similarly having linear drive mechanisms are joined to Y-axis beam 8 so as to move freely in the Y-direction. X-axis beams 9 are provided along the X-direction. In each of two X-axis beams 9, mounting head 10 is installed so as to move freely in the X-direction. As illustrated in FIG. 4, mounting head 10 has plurality of suction units 10a which can suck, hold, lift, and lower component D. Each of leading ends of suction units 10a is provided with suction nozzle 10b.

FIG. 3, when Y-axis beam 8 and X-axis beams 9 are driven, mounting heads 10 move in the X-direction and the Y-direction. Accordingly, two mounting heads 10 suck and pick up components D from the component pick-up positions of tape feeders 7 respectively disposed in the corresponding component suppliers 6, by using suction nozzle 10b and mount components D at mounting points in board B positioned in board transport mechanism 5. Y-axis beam 8, X-axis beams 9, and mounting heads 10 configure the component mounting mechanism which mounts component D in board 8 by moving mounting heads 10 holding components D.

Between component supplier 6 and board transport mechanism 5, component recognition camera 11 is provided. When mounting head 10 which has picked up the component from component supplier 6 moves above component recognition camera 11, component recognition, camera 11 images component D in a state of being held by mounting bead 10 and recognizes the holding posture of component D. In plate 9a in which mounting head 10 is fitted, board recognition camera 12 is fitted. Board recognition camera 12 moves integrally with mounting head 10.

When mounting head 10 moves, board recognition camera 12 moves above board B positioned in board transport mechanism 5 and images a board mark (not illustrated) provided in board B, thereby recognizing the position of board B. In an operation in which mounting head 10 mounts a component in board B, the mounting position is corrected by adding a recognition result of component D obtained by component recognition camera 11 and a recognition result of the board position obtained by board recognition camera 12.

In FIG. 4, component supplier 6 is configured with carriage 13 in which plurality of tape feeders 7 are installed in feeder base 13a in advance. Carriage 13 is configured to be attached and detached freely with respect to base 4. Carriage 13 has cassette holder 15 that can hold plurality of tape cassettes C in each of which carrier tape 14 is stored in a wound state. Cassette holder 15 has plurality of upward holding positions Hu and plurality of downward holding positions Hd for holding tape cassettes C. That is, cassette holder 15 configures a container holding device holding tape cassette C (container). Carrier tape 14 drawn out from tape cassette C held by cassette holder 15 is installed in tape feeder 7.

In this manner, component mounter M3 has cassette holder 15 (container holding device) holding tape cassette C (container). In component mounter M3, board transport mechanism 5, component suppliers 6, the component mounting mechanisms (Y-axis beams 8, X-axis beams 9, and mounting heads 10), component recognition cameras 11, and board recognition cameras 12 configure component mounting worker 16 (refer to FIG. 14) mounting components D supplied by tape feeders 7 in the transported board B.

Next, with reference to FIG. 5, the configuration and the function of tape feeder 7 will be described. Tape feeder 7 (component feeder) has a function of transporting carrier tape 14 which stores component D and is covered with a cover tape to the component pick-up position, peeling off the cover tape in front of the component pick-up position, and supplying stored component D to component mounters M3 to M6. Tape feeder 7 (component feeder) illustrated in the present embodiment is a so-called auto-loading feeder which can automatically install carrier tape 14 (component D) in tape feeder 7 by inserting the leading end of carrier tape 14 into a tape insertion port.

The auto-loading feeder can supply the component by inserting following carrier tape 14 (hereinafter, will be abbreviated to "following tape 14(2)") into the tape insertion port while leading carrier tope 14 (hereinafter, will be abbreviated to "leading tape 14(1)") which has already been installed in tape feeder 7 supplies component D.

Figure 5:
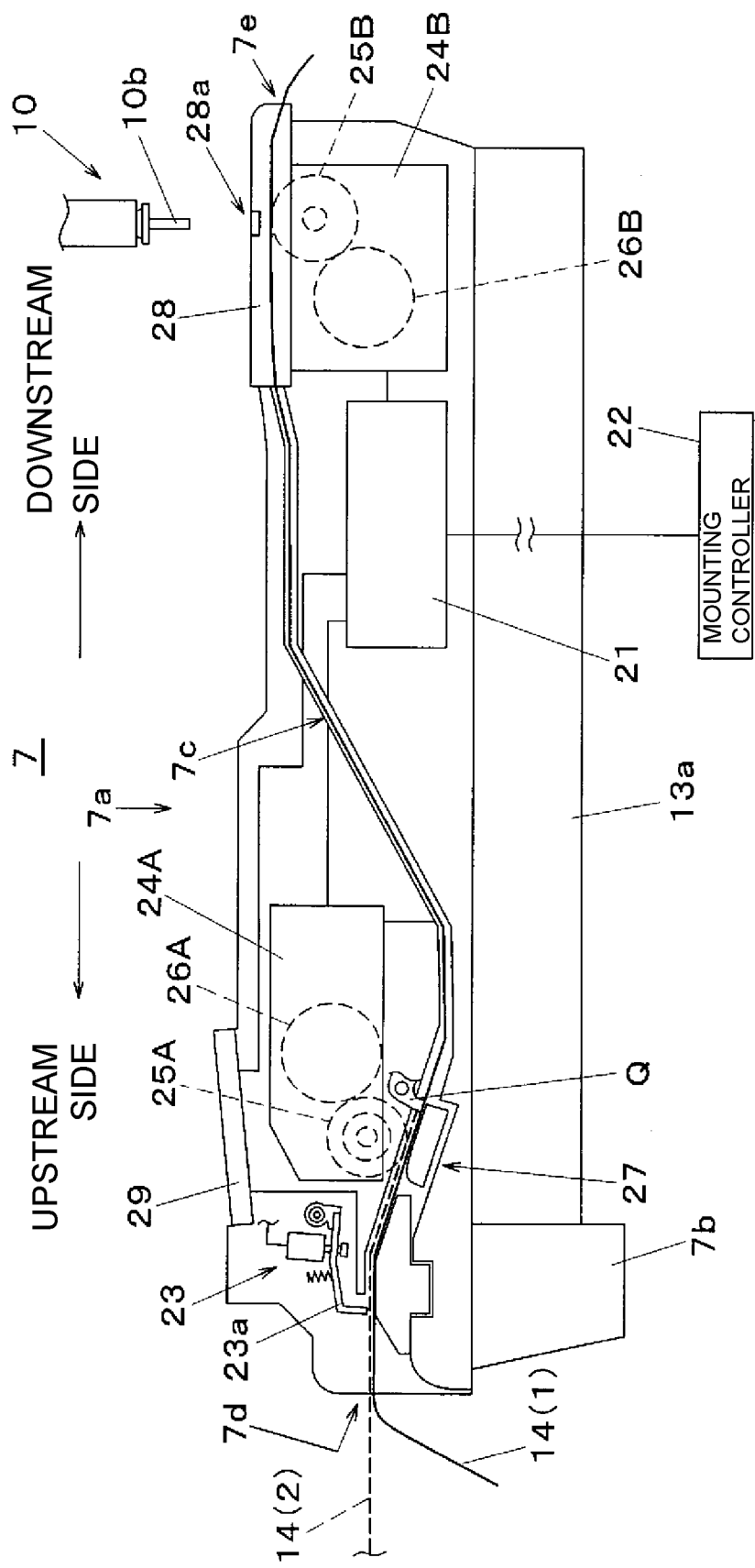
FIG. 5 is a view describing a configuration of a tape feeder included in the component mounting system of the embodiment of the present invention.

In FIG. 5, tape feeder 7 is configured to have body 7a and installer 7b which is projected downward from the bottom surface of body 7a. In a state where tape feeder 7 is installed while the bottom surface of body 7a is located along feeder base 13a, tape feeder 7 is fixedly installed in component supplier 6, and feeder controller 21 which is built in so as to control tape feeding in tape feeder 7 is electrically connected to mounting controller 22 of component mounters M3 to M6.

Inside body 7a, there is provided tape transport path 7c guiding carrier tape 14 which is drawn out from tape cassette C and is taken into body 7a. Tape transport path 7c is provided so as to communicate from tape insertion port 7d which is open at the upstream end in the tape feed direction in body 7a and in which carrier tape 14 is inserted, to tape discharge port 7e which is open on a downstream side of the component pick-up position where mounting head 10 picks up the component.

On the downstream side of tape insertion port 7d, there is provided shutter mechanism 23. Shutter mechanism 23 has a function of causing shutter 23a included in shutter mechanism 23 to be vertically moved such that earner tape 14 inserted through tape insertion port 7d is allowed to or is prohibited from entering tape transport path 7c on the downstream side. The vertical movement of shutter 23a is controlled by feeder controller 21. In this manner, in tape insertion port 7d of tape feeder 7, there is provided shutter 23a allowing or prohibiting the insertion of carrier tape 14.

In FIG. 5, on the upstream side and the downstream side of tape transport path 7c, there are respectively provided first tape feed mechanism 24A and second tape feed mechanism 24B for tape-feeding leading tape 14(1) and following tape 14(2). First tape feed mechanism 24A provided on the upstream side has a function of successively tape-feeding newly installed following tape 14(2) from tape insertion port 7d side to second tape feed mechanism 24B side. First tape feed mechanism 24A has a configuration in which sprocket 25A is rotatively driven by motor 26A. The rotative drive of motor 26A is controlled by feeder controller 21.

Below sprocket 25A of first tape feed mechanism 24A, there is provided biasing mechanism 27. Biasing mechanism 27 has a function of biasing following tape 14(2) inserted through tape insertion port 7d to sprocket 25A such that feed hole 14a (refer to FIG. 7A) of carrier tape 14 engages with sprocket 25A. On the downstream side of sprocket 25A, there is provided insertion detection sensor Q detecting the leading end of following tape 14(2) after following tape 14(2) is inserted through tape insertion port 7d and engages with sprocket 25A.

A detection result of insertion detection sensor Q is transmitted to feeder controller 21. That is, insertion detection sensor Q configures a tape insertion detector detecting that following tape 14(2) (carrier tape 14) is normally inserted. As a method of detecting that carrier tape 14 is normally inserted, rotation of sprocket 25A which rotates when the tape is inserted may be detected.

In FIG. 5, second tape feed mechanism 24B provided on the downstream side has a function of pitch-feeding leading tape 14(1) to the component pick-up position where mounting head 10 picks up component D, at a predetermined feeding pitch. Second tape feed mechanism 24B has a configuration in which sprocket 25B is rotatively driven by motor 26B. The rotative drive of motor 26B is controlled by feeder controller 21. Above second tape feed mechanism 24B, retaining member 28 having a function of retaining leading tape 14(1) from above and peeling off the cover tape so as to expose component D stored in leading tape 14(1) is installed.

Component D pitch-fed to component pick-up position 28a is picked up through vacuum-suction by suction nozzle 10b of mounting head 10 via a component pick-up opening formed in retaining member 28. In this manner, first tape feed mechanism 24A and second tape feed mechanism 24B configure tape feed mechanism 24 (refer to FIG. 15A) transporting carrier tape 14 (leading tape 14(1) and following tape (2)) and transporting stored component D to component pick-up position 28a.

In FIG. 5, on the top surface of tape feeder 7 on the upstream side, operation/display panel 29 connected to feeder controller 21 is disposed. In operation/display panel 29, there are provided various types of operation buttons such as an operation button for operating tape feed operations performed by first tape feed mechanism 24A and second tape feed mechanism 24B, and an operation button for an operation of opening mid closing the shutter in shutter mechanism 23. Moreover, in operation/display panel 29, there is provided a display panel such as an LED and a liquid crystal display. In this manner, tape feeder 7 (component feeder) is the auto-loading feeder and has tape insertion port 7d through which the leading end of carrier tape 14 to be supplied is inserted.

Figure 6A:
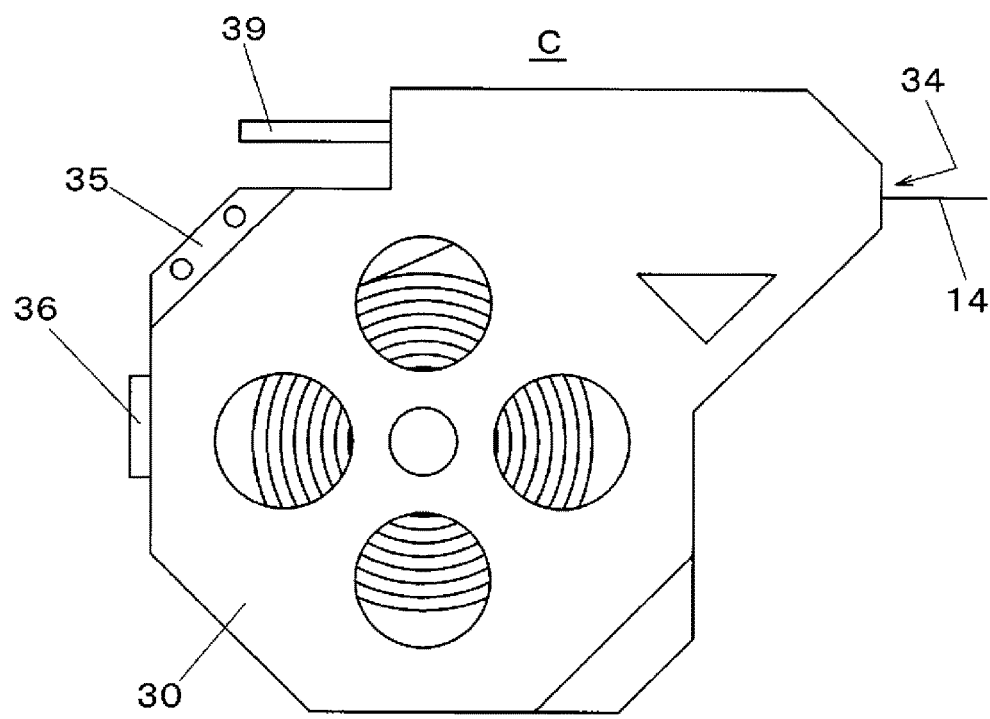
FIG. 6A is a view describing a configuration of a state where a cover is installed in a tape cassette included in the component mounting system of the embodiment of the present invention.
Figure 6B:
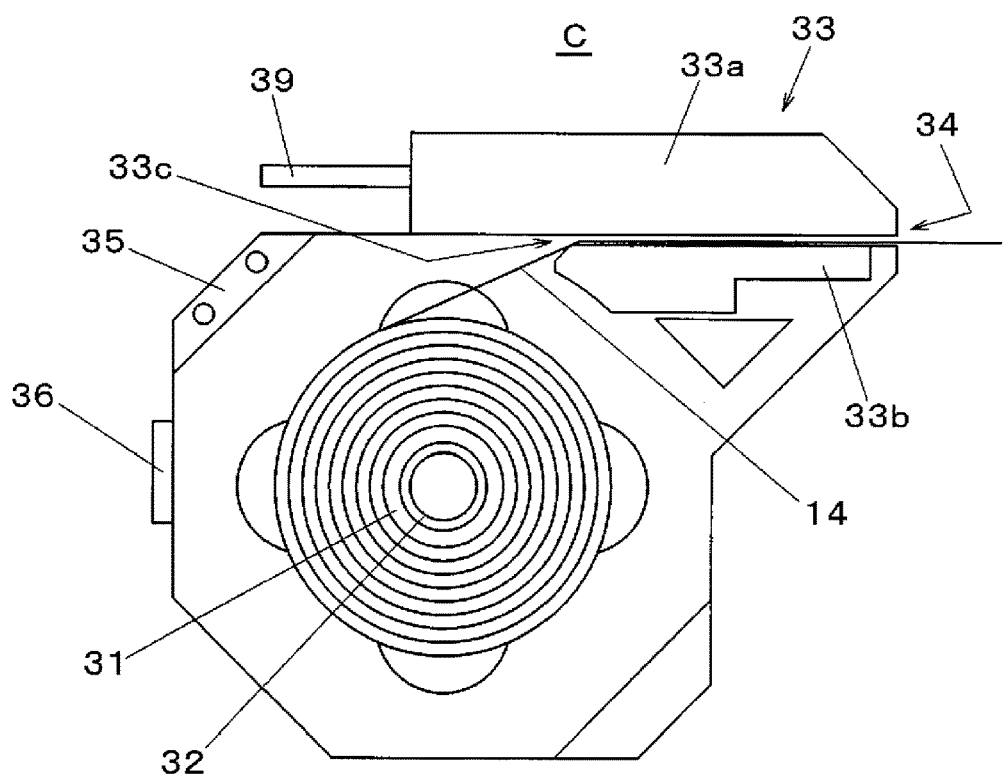
FIG. 6B is a view describing a configuration of a state where the cover is removed from the tape cassette included in the component mounting system of the embodiment of the present invention.

Next, with reference to FIGS. 6A to 7C, the configuration and the function of tape cassette C will be described. FIG. 6A illustrates a state where cover 30 is installed in tape cassette C, and FIG. 6B illustrates a state where cover 30 is removed. In FIG. 6B, in core 31, carrier tape 14 holding plurality of components D while having core 31 as a core is wound around. Core 31 having carrier tape 14 wound around is installed in core holder 32 of tape cassette C so as to rotate freely. Above tape cassette C there is provided tape extrusion mechanism 33. Tape extrusion mechanism 33 is configured to include upper extrusion mechanism 33a and lower extrusion mechanism 33b. Between upper extrusion mechanism 33a and lower extrusion mechanism 33b, tape guide path 33c for guiding extruded carrier tape 14 is formed.

Carrier tape 14 wound around core 31 passes through tape guide path 33c of tape extrusion mechanism 33 and is picked up to the outside through pick-up port 34. In tape cassette C, there is provided gripper 35 at a position accessible from the opposite side of pick-up port 34. Gripper 35 is gripped by mobile component supply device V when tape cassette C is supplied to cassette holder 15, or when tape cassette C is collected from cassette holder 15. In addition, in tape cassette C, at the position accessible from the opposite side of pick-up port 34, there is provided RFID 36 transmitting and receiving identification information N of tape cassette C. In this manner, tape cassette C configures the container storing plurality of components D.

Figure 7A:
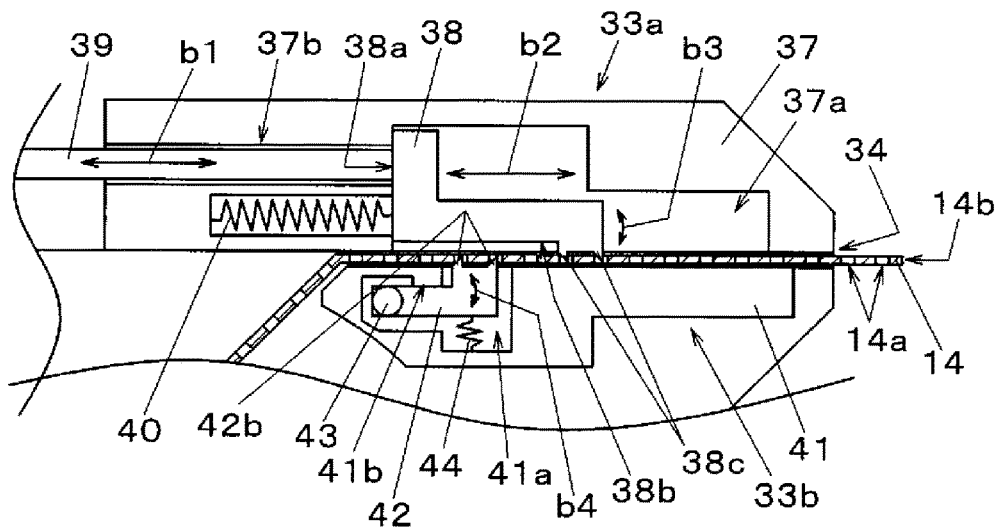
FIG. 7A is a view describing a configuration of a tape extruder mechanism of the tape cassette included in the component mounting system of the embodiment of the present invention.

In FIG. 7A, in body 37 of upper extrusion mechanism 33a, there is provided substantially L-shaped extrusion member 38 which slides forward and backward in tape guide path 33c along guide 37a formed in body 37. In addition, in body 37, insertion hole 37b in which extrusion rod 39 is inserted from the opposite side of pick-up port 34 and slides is formed. Due end of extrusion rod 39 inserted through insertion hole 37b is fitted to surface 38a positioned in extrusion member 38 on the opposite side of pick-up port 34. Accordingly, extrusion rod 39 and extrusion member 38 are integrated and moves forward and backward alone tape guide path 33c (arrow b1 and arrow b2). In addition, on same surface 38a, one end of spring 40 which is an elastic body biasing extrusion member 38 to the opposite side of pick-up port 34 is fitted. The other end of spring 40 is connected to body 37.

On a side close to pick-up port 34 on bottom surface 38b facing tape guide path 33c of extrusion member 38, two teeth 38c protruding toward tape guide path 33c is formed. The gap between two teeth 38c is formed so as to be the same as the gap between feed holes 14a of carrier tape 14. Two teeth 38c respectively engage with feed holes 14a of carrier tape 14 inserted in tape guide path 33c. The bottom surfaces of two teeth 38c respectively have inclinations ascending to the opposite side of pick-up port 34. In addition, in extrusion member 38, two teeth 38c side is vertically (arrow b3) oscillatable.

When two teeth 38c move to pick-up port 34 in a state of engaging with feed holes 14a, extrusion member 38 can extrude carrier tape 14 to the outside through pick-up port 34. Meanwhile, when extrusion member 38 returns to a side opposite to pick-up port 34, extrusion member 38 vertically oscillates in a state where the inclinations of the bottom surfaces of two teeth 38c are located along feed holes 14a. Then, two teeth 38c are disengaged from feed holes 14a. In this manner, extrusion rod 39 and extrusion member 38 configure a carrier tape extrusion member of which one end engages with stored carrier tape 14 and the other end protrudes out of tape cassette C (container).

In FIG. 7A, in space 41a formed in body 41 of lower extrusion mechanism 33b, there is provided substantially L-shaped oscillation member 42. Oscillation shaft 43 fitted to body 41 is connected to the opposite side of pick-up port 34 of oscillation member 42. Pick-tip port 34 side of oscillation member 42 vertically (arrow b4) oscillates around oscillation shaft 43. Below pick-up port 34 side of oscillation member 42, there is provided spring 44 which is an elastic body biasing oscillation member 42 upward. The upward oscillation of oscillation member 42 is restricted by restricting surface 41b formed in space 41a of body 41.

On a side close to pick-up port 34 on the top surface facing tape guide path 33c of oscillation member 42, in a state where the upward oscillation is restricted by restricting surface 41b, two teeth 42b protruding toward tape guide path 33c are formed. The gap between two teeth 42b is formed so as to be the same as the gap between feed holes 14a of carrier tape 14. Two teeth 42b respectively engage with feed holes 14a of carrier tape 14 inserted in tape guide path 33c. The top surfaces of two teeth 42b respectively have Inclinations descending to the opposite side of pick-up port 34.

In a state where two teeth 42b engage with feed holes 14a, when carrier tape 14 is extruded in a direction of pick-up port 34, oscillation member 42 vertically oscillates in a state where the inclinations of the top surfaces of two teeth 42b are located along feed holes 14a. Then, two teeth 42b are disengaged from feed holes 14a. Accordingly, movement of extruded carrier tape 14 to the outside is not hindered by oscillation member 42. Meanwhile, when tape 14 tends to move in a direction (inside) opposite to pick-up port 34, two teeth 42b of oscillation member 42 engage with feed holes 14a, thereby restraining the movement of carrier tape 14.

Next, with reference to FIGS. 7A to 7C, a step of extruding carrier tape 14 in tape cassette C will be described. In FIG. 7A, in carrier tape 14 stored in tape cassette C, feed holes 14a engage with two teeth 38c of extrusion member 38 and two teeth 42b of oscillation member 42, and leading end 14b of carrier tape 14 is located outside pick-up port 34. Extrusion member 38 is positioned on a side far from pick-up port 34.

Figure 7B:
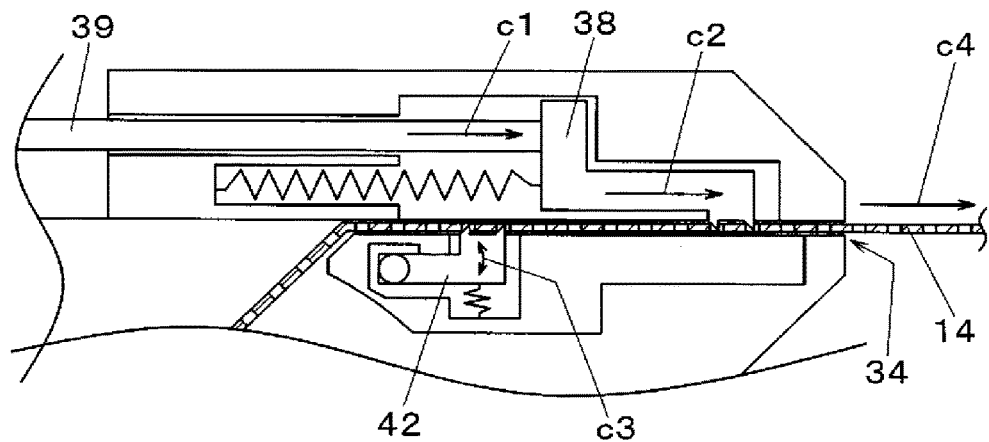
FIG. 7B is another view describing the configuration of the tape extruder mechanism of the tape cassette included in the component mounting system of the embodiment of the present invention.

From this state, in FIG. 7B, when extrusion rod 39 is pushed in from the outside due to an external force (arrow c1), two teeth 38c of extrusion member 38 are pushed and moved in the direction of pick-up port 34 in a state of engaging with feed holes 14a of carrier tape 14 (arrow c2). Accordingly, carrier tape 14 moves in the direction of pick-up port 34. In this case, oscillation member 42 vertically (arrow c3) oscillates and two teeth 42b are disengaged from feed holes 14a. Therefore, movement of carrier tape 14 is not hindered. In this manner, carrier tape 14 is extruded outward through pick-up port 34 (arrow c4).

Figure 7C:
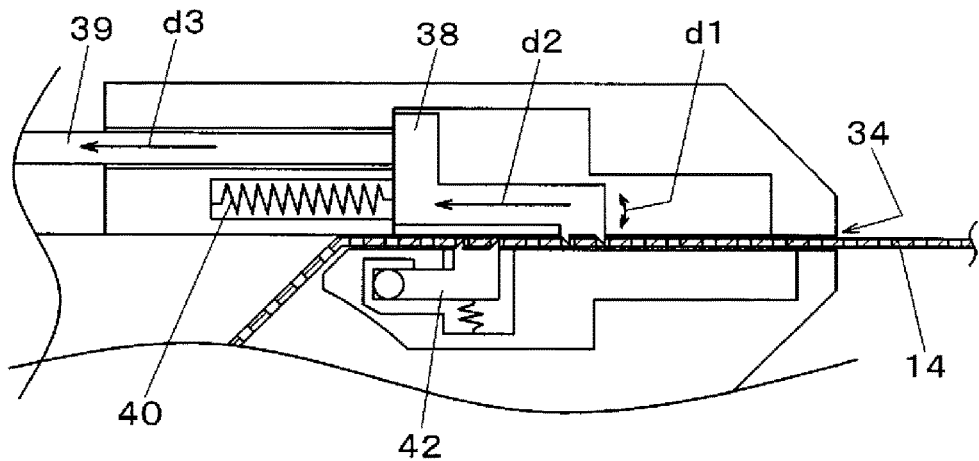
FIG. 7C is a further another view describing the configuration of the tape extruder mechanism of the tape cassette included in the component mounting system of the embodiment of the present invention.

FIG. 7C, in extrusion rod 39, the inward pushing force is eliminated. Therefore, extrusion member 38 returns to a side opposite to pick-up port 34 by spring 40 of upper extrusion mechanism 33a. In this case, carrier tape 14 is inhibited from moving by oscillation member 42 of which two teeth 42b engage with teed holes 14a. Therefore, extrusion member 38 vertically (arrow d1) oscillates such that two teeth 38c are disengaged from feed holes 14a, and extrusion member 38 moves to a side opposite to pick-up port 34 (arrow d2). Extrusion rod 39 is pushed by extrusion member 38 so as to be pushed back to a side opposite to pick-up port 34 (arrow d3).

When carrier tape 14 is extruded from tape cassette C, in order to extrude carrier tape 14 as much as a desired length, a push-in step illustrated in FIG. 7B and a return step illustrated in FIG. 7C are repetitively executed. When tape feeder 7 performs tape feeding of carrier tape 14 outward through pick-up port 34, in the state illustrated in FIG. 7A, each of extrusion member 38 and oscillation member 42 vertically (arrow b3 and arrow b4) oscillates. Accordingly, two teeth 38c of extrusion member 38 and two teeth 42b of oscillation member 42 are individually disengaged from feed holes 14a, and movement of carrier tape 14 in a direction toward tape feeder 7 is not hindered.

According to such tape cassette C, leading end 14b of carrier tape 14 can be accurately sent out in a predetermined direction, and leading end 14b of carrier tape 14 can be inserted in tape feeder 7. In addition, since carrier tape 14 can be sent out by an external force, the tape can be sent out without providing a drive source in tape cassette C. Therefore, the device can be compact.

Figure 8A:
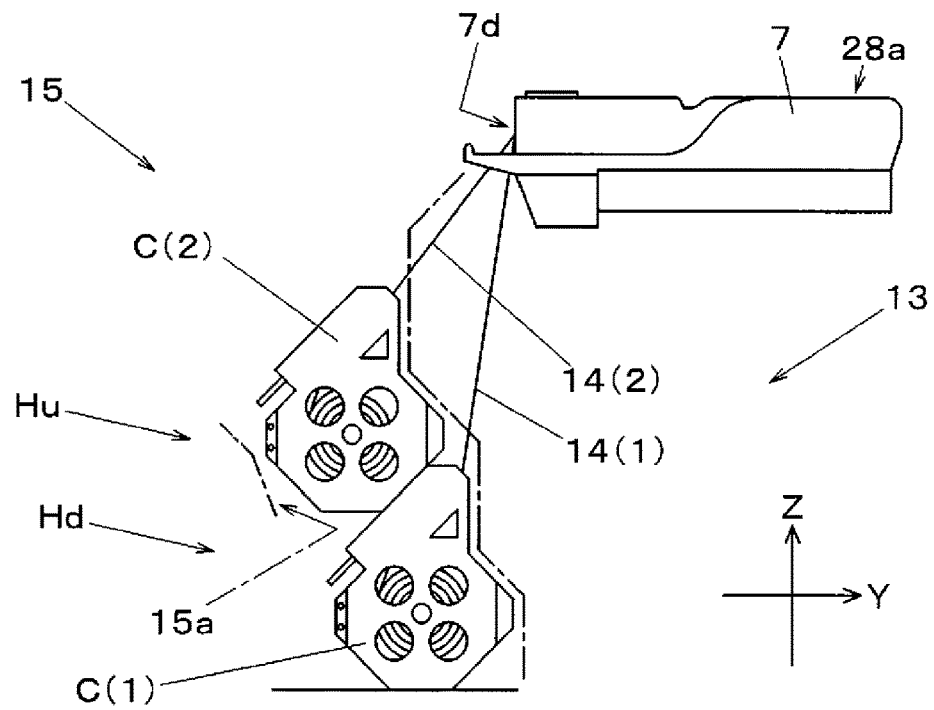
FIG. 8A is a view describing a step in which the tape cassette is replaced in a cassette holder included in the component mounting system of the embodiment of the present invention.

Next, with reference to FIGS. 8A to 9B, a method of replacing (supplying) tape cassette C in cassette holder 15 will be described. In FIGS. 8A to 9B, for convenience, the structures of carriage 13 and cassette holder 15 are shown in a simplified manner. As illustrated in FIG. 8A, in cassette holder 15, there is provided downward holding position Hd for holding tape cassette C(1) in which leading tape 14(1) is wound and stored. In addition, in cassette holder 15, there is provided upward holding position Hu for holding tape cassette C(2) in which following tape 14(2) is wound and stored, above downward holding position Hd.

That is, cassette holder 15 (container holding device) has upward holding position Hu (first holding portion) for holding tape cassette C(2) (container), and downward holding position Hd (second holding position) for holding tape cassette C(1) (container) supplied prior to tape cassette C(2) (container) held at upward holding position Hu (first holding position). In addition, in the inner wall of cassette holder 15, groove 15a for guiding tape cassette C is formed. In FIGS. 8A to 9B, for convenience, groove 15a is simplified and shown with one-dot chain line. Tape cassette C supplied to cassette holder 15 moves downward along groove 15a in the inner wall due to gravity.

In FIG. 8A, in tape insertion port 7d of tape feeder 7, leading tape 14(1) and following tape 14(2) are inserted. In tape feeder 7, components D stored in leading tape 14(1) is supplied to component pick-up position 28a. In a process of continuously executing the component mounting work, when components D of leading tape 14(1) are completely consumed, components D stored in following tape 14(2) are consecutively supplied to component pick-up position 28a.

Figure 8B:
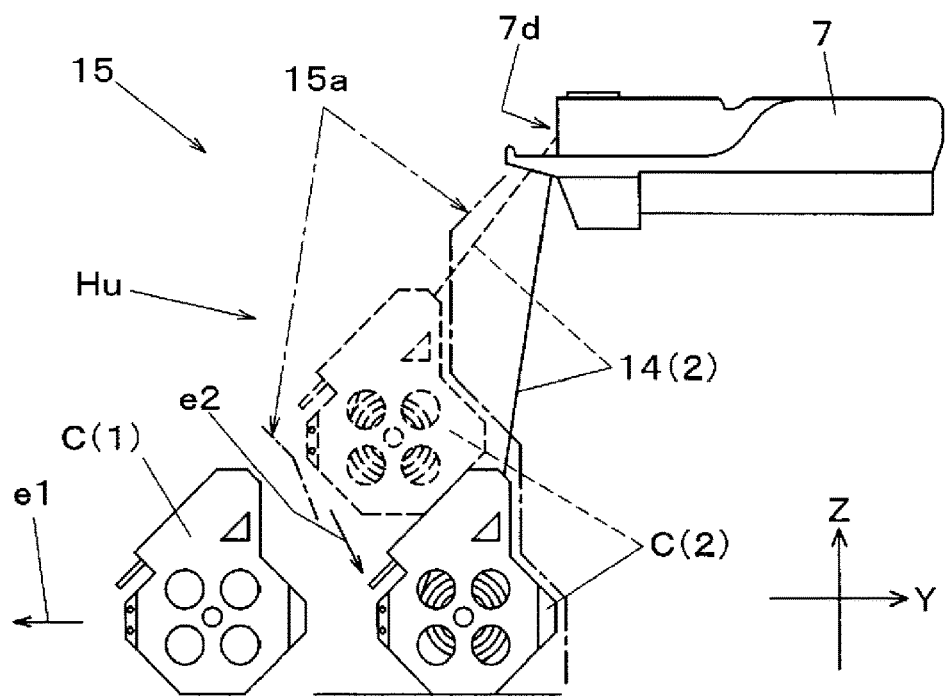
FIG. 8B is another view describing the step in which the tape cassette is replaced in the cassette holder included in the component mounting system of the embodiment of the present invention.

In FIG. 8B, empty leading tape cassette C(1) in which components D are completely consumed is drawn out in the horizontal direction (arrow e1) from downward holding position Hd of cassette holder 15 by collecting head 60 (refer to FIG. 10) of mobile component supply device V described below, thereby being collected (leading cassette collecting step). Thereafter, following tape cassette C(2) moves from upward holding position Hu to the vacant downward holding position Hd along groove 15a (arrow e2) (following cassette moving step).

That is, when tape cassette C(1) (container) held at downward holding position Hd (second holding position) is evulsed and removed, tape cassette C(2) (container) held at upward holding position Hu (first holding position) moves to downward holding position Hd (second holding position). In this manner, since tape cassette C at upward holding position Hu moves to downward holding position Hd due to gravity, the position of tape cassette C can be changed by performing only an evulsing operation.

Figure 9A:
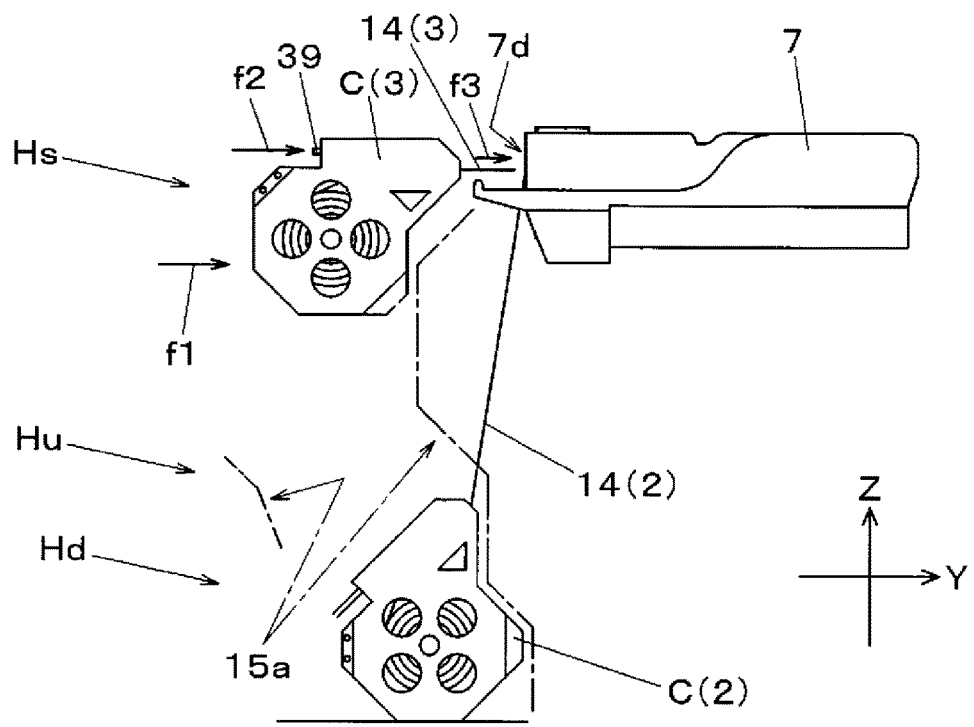
FIG. 9A is further another view describing the step in which the tape cassette is replaced in the cassette holder included in the component mounting system of the embodiment of the present invention.

In FIG. 9A, subsequently, tape cassette C(3) to be supplied is disposed behind tape feeder 7, that is, at supply position Hs (arrow f1) of cassette holder 15 where leading end 14b of carrier tape 14(3) protruding through pick-up port 34 of tape cassette C(3) is positioned behind tape insertion port 7d of tape feeder 7 (supply cassette disposing step). Here, tape cassette C(3) is held at supply position Hs by grip device 57b (refer to FIG. 10) of mobile component supply device V described below.

Subsequently, in a state where tape cassette C(3) is held, extrusion rod 30 is pushed into tape cassette C(3) (arrow f2), while carrier tape 14(3) is extruded (arrow f3), leading end 14b of carrier tape 14(3) is inserted in tape feeder 7 through tape insertion port 7d (supply tape inserting step). Here, extrusion rod 39 is pushed in by tape inserter 57a (refer to FIG. 10) provided in mobile component supply device V described below. Means for pushing extrusion rod 39 is not limited thereto. The means may be provided in component mounters M3 to M6. Otherwise, extrusion rod 39 may be pushed in by means provided in a device other than mobile component supply device V and component mounters M3 to M6.

In addition, means for holding tape cassette C at supply position Hs may be provided in cassette holder 15. Carrier tape 14 is extruded by tape extrusion mechanism 33 of tape cassette C to a position where tape feeding can be performed by at least first tape feed mechanism 24A of tape feeder 7. Here, when tape extrusion mechanism 33 repeats to extrude carrier tape 14 until insertion detection sensor Q of tape feeder 7 detects leading end 14b of carrier tape 14, carrier tape 14 can be positioned at the position mentioned above.

Figure 9B:
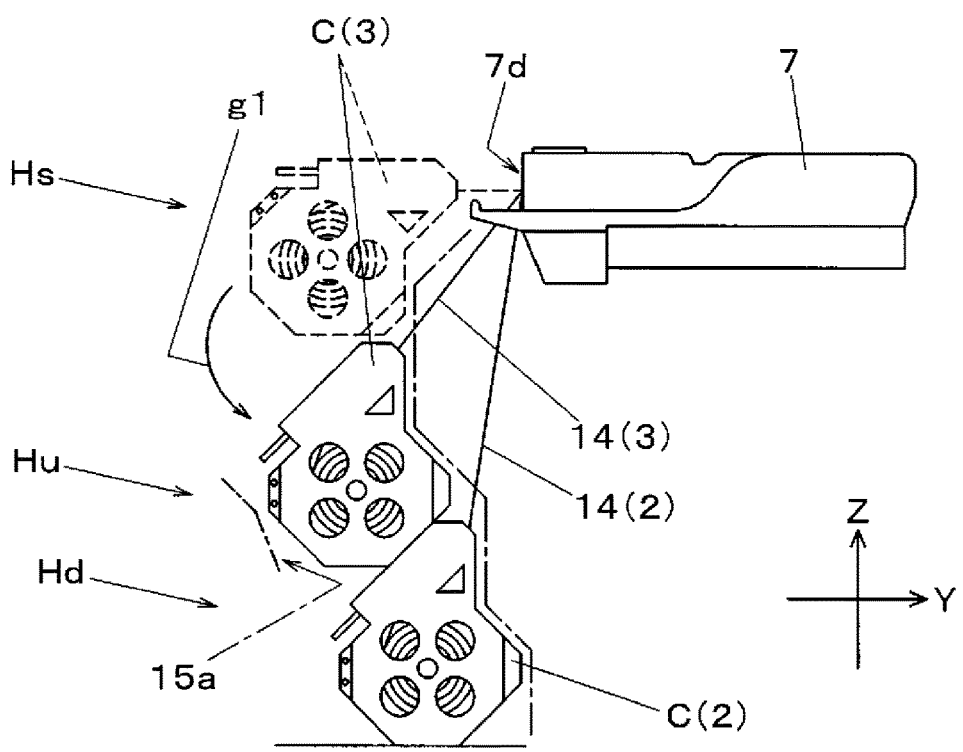
FIG. 9B is still another view describing the step in which the tape cassette is replaced in the cassette holder included in the component mounting system of the embodiment of the present invention.

In FIG. 9B, when installation of carrier tape 14(3) stored in supplied tape cassette C(3) with respect to tape feeder 7 is completed, the holding state of tape cassette C(3) is released. Accordingly, tape cassette C(3) moves from supply position Hs to upward holding position Hu along groove 15a (arrow g1) (supply cassette moving step). In this manner, empty tape cassette C(1) is collected from component mounters M3 to M6, and tape cassette C(3) to be supplied is supplied.

In cassette holder 15 of the present embodiment, as illustrated in FIG. 9B, in a process in which tape cassette C(3) moves from supply position Hs to upward holding position Hu, tape cassette C(3) is rotated 45 degrees while having the horizontal, direction (X-direction in the present embodiment) as a rotary axis such that pick-up port 34 of tape cassette C(3) is oriented obliquely upward. At downward holding position Hd, tape cassette C(2) is held such that pick-up port 34 maintains an angle oriented obliquely upward.

Supply position Hs and upward holding position Hu are positioned so as to have a positional relationship of not overlapping each other in a YZ-planar view viewed in the X-direction. The reason is that an operation in which supply head 57 (described below, refer to FIG. 10) positions tape cassette C in tape feeder 7 is prevented from being hindered by different tape cassette C positioned at upward holding position Hu.

Moreover, pick-up port 34 of tape cassette C(2) at downward holding position Hd is set so as to be at a position closer to tape feeder 7 in the horizontal direction (Y-direction in the present embodiment) than pick-up port 34 of tape cassette C(3) at upward holding position Hu. Accordingly, carrier tape 14(2) supplied by tape cassette C(2) at downward holding position Hd and carrier tape 14(3) supplied, by tape cassette C(3) at upward holding position Hu can be supplied to tape insertion port 7d of the tape feeder 7 without interfering with each other.

Next, with reference to FIGS. 10 and 11, the configurations of mobile component supply device V and carriage 13 will be described. In FIG. 10, mobile component supply device V is configured by stacking carriage 50, supporter 51, and housing unit 52 from below. Carriage 50 has travel mechanism 54 (refer to FIG. 15B) including wheels 53, a motor for driving wheels 53, a mechanism for converting the direction of wheels 53, a sensor for detecting the position and the posture of mobile component supply device V, and a camera (illustration omitted). In addition, in carriage 50, supply controller 55 (refer to FIG. 15B) for controlling travel mechanism 54, wireless communicator T for communicating with management computer 3, and a battery (illustration omitted) are disposed.

Travel controller 55a (refer to FIG. 15B) of supply controller 55 controls travel mechanism 54 so as to move mobile component supply device V based on an instruction from management computer 3 and information gathered directly. Wheels 53 of carriage 50 can freely change the direction and can move freely in the horizontal direction without changing the posture of mobile component supply device V. That is, mobile component supply device V can move in both the X-direction and the Y-direction while maintaining the posture parallel to component mounters M3 to M6 illustrated in FIG. 10.

In addition, travel mechanism 54 has an electromagnetic brake (illustration omitted) and can be continuously stopped at a predetermined position in a state where the electromagnetic brake is applied. In this manner, travel mechanism 54 and travel controller 55a configure a traveller having supporter 51 on the top and moving or stopping automatically.

The bottom of supporter 51 is fixed to carriage 30 and the top is fixed to housing unit 52, thereby supporting housing unit 52 from below. The top of supporter 51 is configured to slide freely in the horizontal direction (X-direction and Y-direction) with respect to the bottom and in the vertical direction (Z-direction). Accordingly, when an external force is added to housing unit 52, housing unit 52 moves in the horizontal direction and the vertical direction with respect to carriage 50.

In addition, supporter 51 is biased by an elastic body (illustration omitted) such as a spring so as to return housing unit 52 to a predetermined central position in a case where no external force is applied. In addition, a lock mechanism (illustration omitted) is built in supporter 5. The lock mechanism fixes the position of housing unit 52 with respect to carriage 50 in a state where housing unit 52 is at a predetermined central position. In a state where housing unit 52 is fixed at a predetermined central position, mobile component supply device V moves travels). In this manner, supporter 51 supports housing unit 52 (container housing unit) from below such that housing unit 52 moves freely in the horizontal direction and the vertical direction.

In FIG. 10, housing unit 52 is configured to include supply cassette housing unit 52a above and collection cassette housing unit 52b below. In supply cassette housing unit 52a, plurality of tape cassettes C to be supplied to component mounters M3 to M6 are housed. In collection cassette housing unit 52b, plurality of tape cassettes C collected from component mounters M3 to M6 are housed. That is, housing unit 52 configures the container housing unit having supply cassette housing unit 52a (first area) housing tape cassettes C (containers) to be supplied and collection cassette housing unit 52b (second area) housing used tape cassettes C (container).

In FIG. 10, in the ceiling of supply cassette housing unit 52a, X-axis beam 56x is provided along the X-direction (travelling direction of mobile component supply device V). In X-axis beam 56x, X-axis slider 56a driven by an X-axis linear drive mechanism is provided so as to move freely in the X-direction along X-axis beam 56x (arrow j1 in FIG. 11). X-axis beam 56x, X-axis slider 56a, and the X-axis linear drive mechanism configure an X-axis moving mechanism.

On the bottom of X-axis slider 56a, there is provided Y-axis beam 56y along the Y-direction (direction orthogonal to the travelling direction of mobile component supply device V). In Y-axis beam 56y, there is provided Y-axis slider 56b driven by the linear drive mechanism so as to move freely in the Y-direction along Y-axis beam 56y (arrow h1). Y-axis beam 56y, Y-axis slider 56b, and a Y-axis linear drive mechanism configure a Y-axis moving mechanism. In Y-axis slider 56b, supply head 57 is installed. Supply head 57 has tape inserter 57a, grip device 57b, and RF reader R.

Grip device 57b grips gripper 35 of supply target tape cassette C housed in supply cassette housing unit 52a. Tape inserter 57a is configured to include an electromagnetic piston and a rod. In a state where supply head 57 grips tape cassette C, when tape inserter 57a causes the rod to protrude, extrusion rod 39 of tape cassette C is pushed into tape cassette C, and carrier tape 14 can be thereby extruded through pick-up port 34. In this manner, the X-axis moving mechanism, the Y-axis moving mechanism, and supply head 57 configure cassette supply mechanism 58 (refer to FIG. 15B) gripping supply target tape cassette C housed at a predetermined position, picking up tape cassette C out of supply cassette housing unit 52a, moving tape cassette C in the X-direction and the Y-direction outside supply cassette housing unit 52a, and extruding carrier tape 14 from tape cassette C.

RF reader R reads identification information N from RFID 36 provided in tape cassette C. In a state where supply head 57 is separated from tape cassette C housed by a predetermined distance, when supply head 57 moves in the X-direction, RF reader R can read identification information N of tape cassette C housed in supply cassette housing unit 52a, at once. In this manner, in mobile component supply device V, RF reader R (information reader) reading identification information N applied to tape cassette C (container) is provided in supply cassette housing unit 52a (first area).

In FIG. 10, in the ceiling of collection cassette housing unit 52b, there is provided X-axis beam 59x along the X-direction (travelling direction of mobile component supply device V). In X-axis beam 59x, there is provided X-axis slider 59a driven by the X-axis linear drive mechanism so as to move freely in the X-direction along X-axis beam 59x (arrow in FIG. 11). X-axis beam 59x, X-axis slider 59a, and the X-axis linear drive mechanism configure the X-axis moving mechanism.

On the bottom of X-axis slider 59a, there is provided Y-axis beam 59y along the Y-direction (direction orthogonal to the travelling direction of mobile component supply device V). In Y-axis beam 59y, there is provided Y-axis slider 59b driven by the linear drive mechanism so as to move freely in the Y-direction along Y-axis beam 59y (arrow h2). Y-axis beam 59y, Y-axis slider 59b, and the Y-axis linear drive mechanism configure the Y-axis moving mechanism, in Y-axis slider 59b, collecting head 60 is installed.

Collecting head 60 has grip device 60a. Grip device 60a grips gripper 35 of collect target tape cassette C held at downward holding position Hd of cassette holder 15 of component mounters M3 to M6. Collecting head 60 takes gripped tape cassette C to a predetermined position of collection cassette housing unit 52b. Thereafter, collecting head 60 cancels the gripped state and houses collect target tape cassette C. In this manner, the X-axis moving mechanism, the Y-axis moving mechanism, and collecting head 60 configure cassette collection mechanism 61 (refer to FIG. 15B) moving in the X-direction and the Y-direction outside collection cassette housing unit 52b, gripping collect target tape cassette C, and housing collect target tape cassette C at a predetermined position of collection cassette housing unit 52b.

Figure 11:
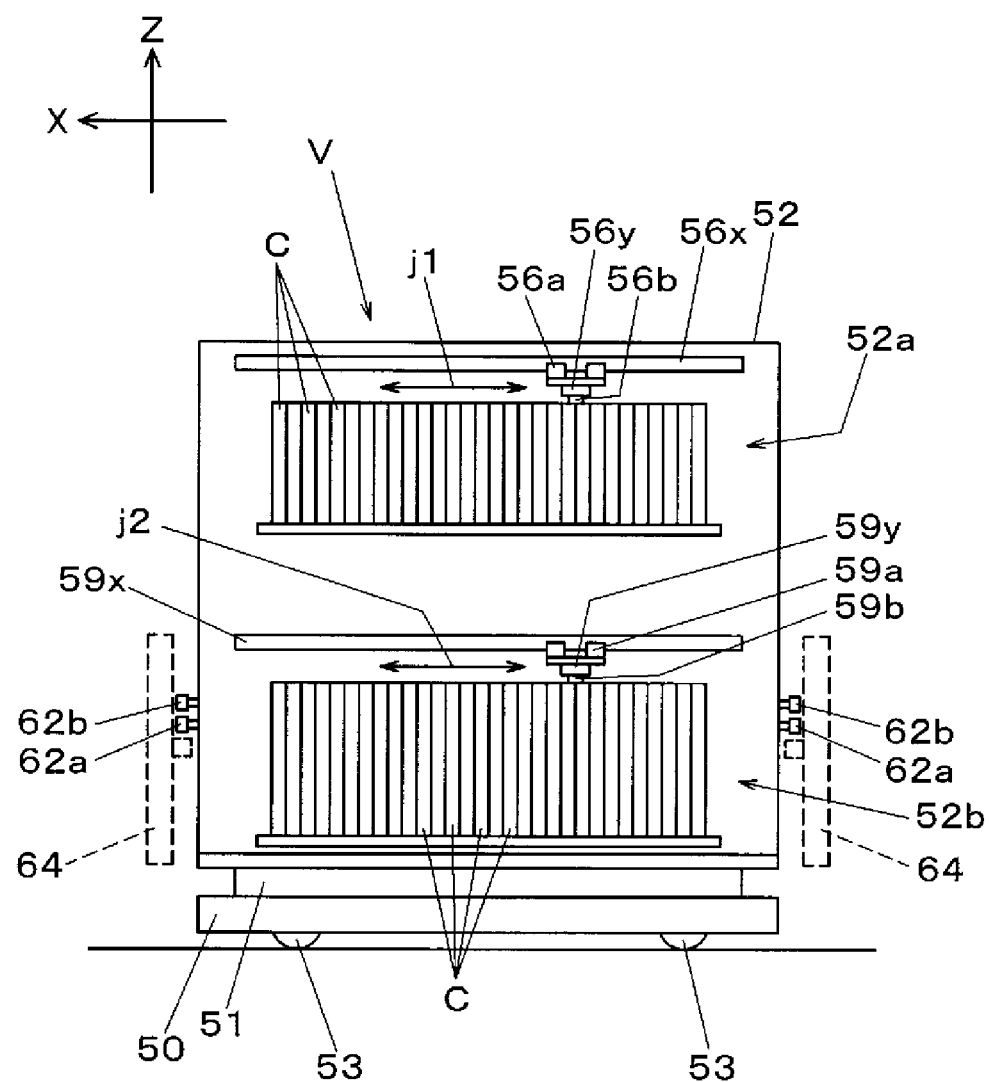
FIG. 11 is a view describing a configuration of the mobile component supply device included in the component mounting system of the embodiment of the present invention.

In FIG. 11, in housing unit 52, on the side where tape cassette C is picked up from supply cassette housing unit 52a and the side where tape cassette C is collected in collection cassette housing unit 52b, outer walls are eliminated so as not to interfere with each other when tape cassette C is taken out and inserted. When tape cassettes C are supplied and collected in component mounters M3 to M6, mobile component supply device V automatically performs positioning while travelling such that the surface on which tape cassette C is taken out and inserted becomes parallel to component supplier 6.

In FIG. 10, in the outer wall of housing unit 52 in the X-direction, there are provided coupling roller 62*a* and coupling hook 62*b* respectively (also refer to FIG. 11). Coupling roller 62*a* and coupling hook 62*b* are provided so as to be separated from each other by a predetermined distance in the Y-direction. In addition, there is provided coupler 63 on the front surface (position opposite to tape feeder 7 interposing cassette holder 15 therebetween) of cassette holder 15 of carriage 13 in which plurality of tape feeders 7 are installed. Coupler 63 is fixedly provided in carriage 13. Both ends of coupler 63 in the X-direction have pair of guiders 64.

Guiders 64 respectively have positioning block 65 and coupling mechanism 66. When housing unit 52 of mobile component supply device V is coupled to coupler 63, positioning block 65 is in contact with coupling roller 62*a* of housing unit 52 and housing unit 52 is positioned in the Z-direction. Coupling mechanism 66 is configured to include substantially L-shaped coupling member 66*a* and air cylinder 66*b* lifting coupling member 66*a* obliquely upward. In addition, a sensor (illustration omitted) detecting that coupling hook 62*b* of housing unit 52 is in contact with coupling member 66*a* when housing unit 52 of mobile component supply device V is coupled to coupler 63 is built in coupling mechanism 66.

Figure 12A:
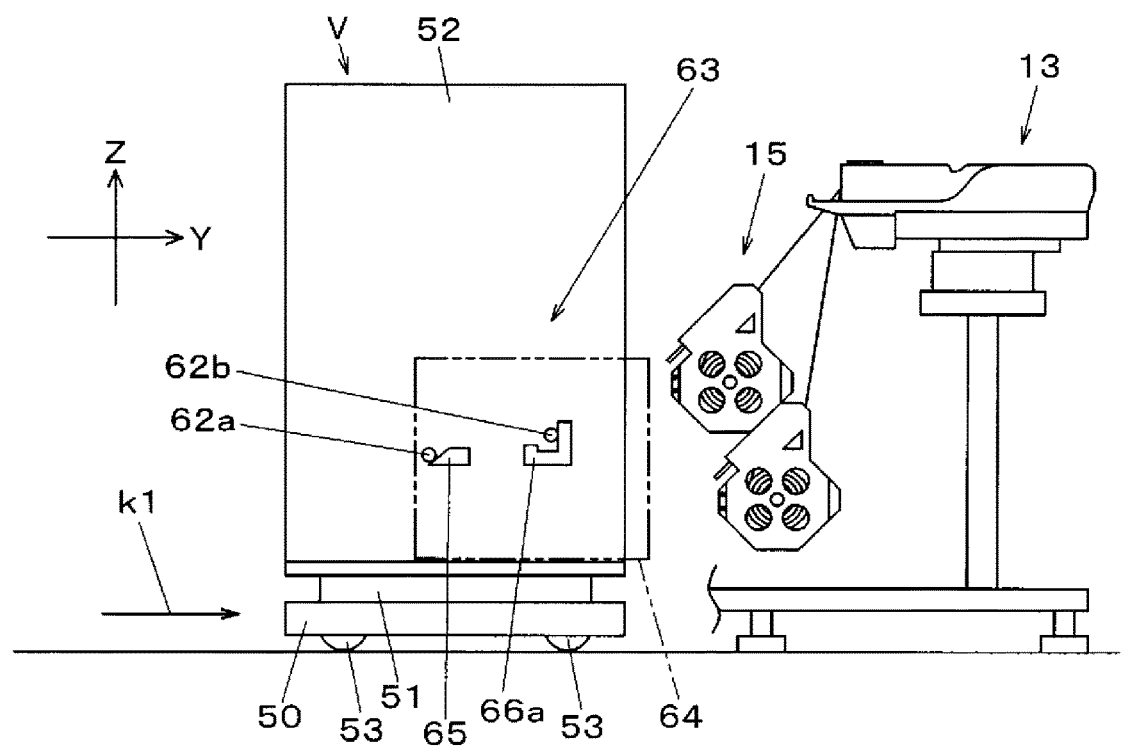
FIG. 12A is a view describing a step in which a housing unit of the mobile component supply device included in the component mounting system of the embodiment of the present invention is coupled to the coupler.

Next, with reference to FIGS. 12A and 12B, a method in which housing unit 52 of mobile component supply device V is coupled to coupler 63 will be described. In FIG. 12A, mobile component supply device V travels in a direction so as to be parallel to carriage 13 of component mounters M3 to M6, approaches carriage 13 thereof, adjusts the X-direction to a position where housing unit 52 is settled between pair of guiders 64 of coupler 63, and temporarily stops. Mobile component supply device V cancels the lock mechanism of supporter 51. Subsequently, while maintaining the posture to be parallel to carriage 13, mobile component supply device V moves in the Y-direction at low speed (arrow k1). When coupling hook 62*b* of housing unit 52 arrives at a stop position being in contact with coupling member 66*a*, mobile component supply device V stops the movement and operates the electromagnetic brake of travel mechanism 54.

Figure 12B:
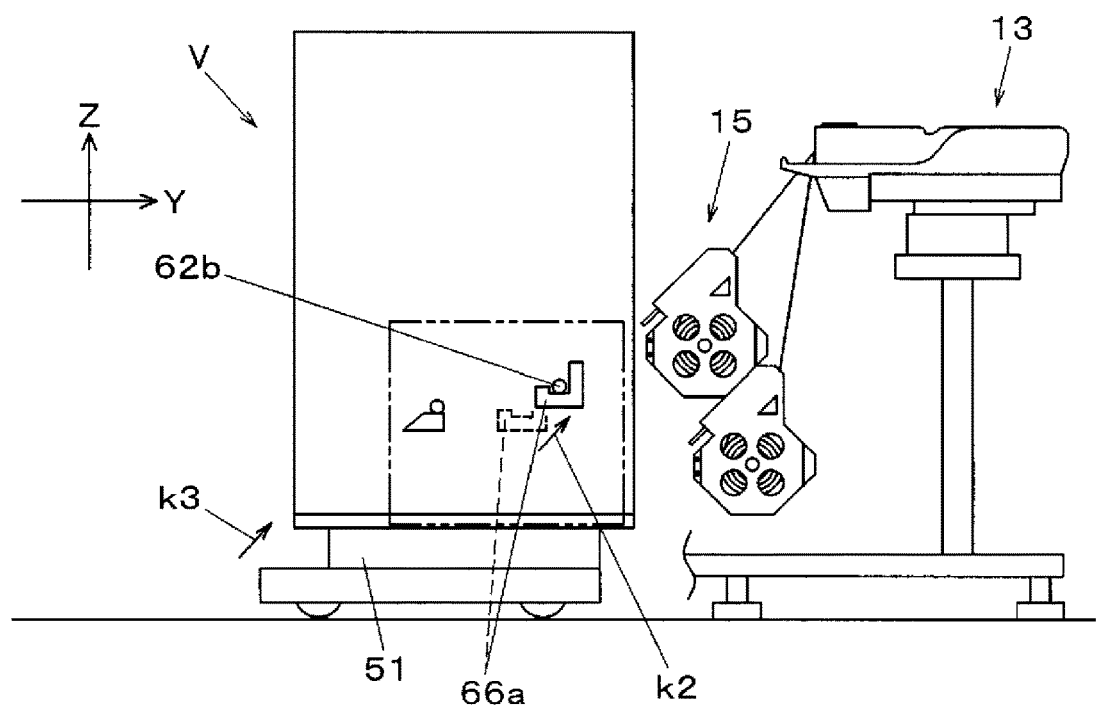
FIG. 12B is another view describing the step in which the housing unit of fee mobile component supply device included in the component mounting system of the embodiment of the present invention is coupled to the coupler.

In FIG. 12B, subsequently, coupling mechanism 66 lifts coupling member 66*a* coupled to coupling book 62*b* obliquely upward (arrow k2). Accordingly, housing unit 52 transfers to carriage 13 via coupler 63 (arrow k3), thereby being in a state where supplying work and collecting work of tape cassettes C can be performed by housing unit 52 (replacement preparing work is completed).

As described above, mobile component supply device V has a function of holding tape cassette C (container) storing plurality of components D, moving automatically, and supplying components D of tape cassette C to tape feeder 7 (component feeder). In more detail, mobile component supply device V has housing unit 52 (container housing unit) housing tape cassette C, and cassette supply mechanism 58 and cassette collection mechanism 61 (container mover) moving tape cassette C between housing unit 52 and cassette holder 15 (container holding device).

In addition, component mounters M3 to M6 has coupler 63 coupled to and holds housing unit 52. When tape cassette C is moved by the container mover between housing unit 52 and cassette holder 15, the traveller (travel mechanism 54 and travel controller 55*a*) stops mobile component supply device V at a predetermined stop position with respect to component mounters M3 to M6, and coupler 63 is coupled to housing unit 52 and holds housing unit 52.

Figure 13A:
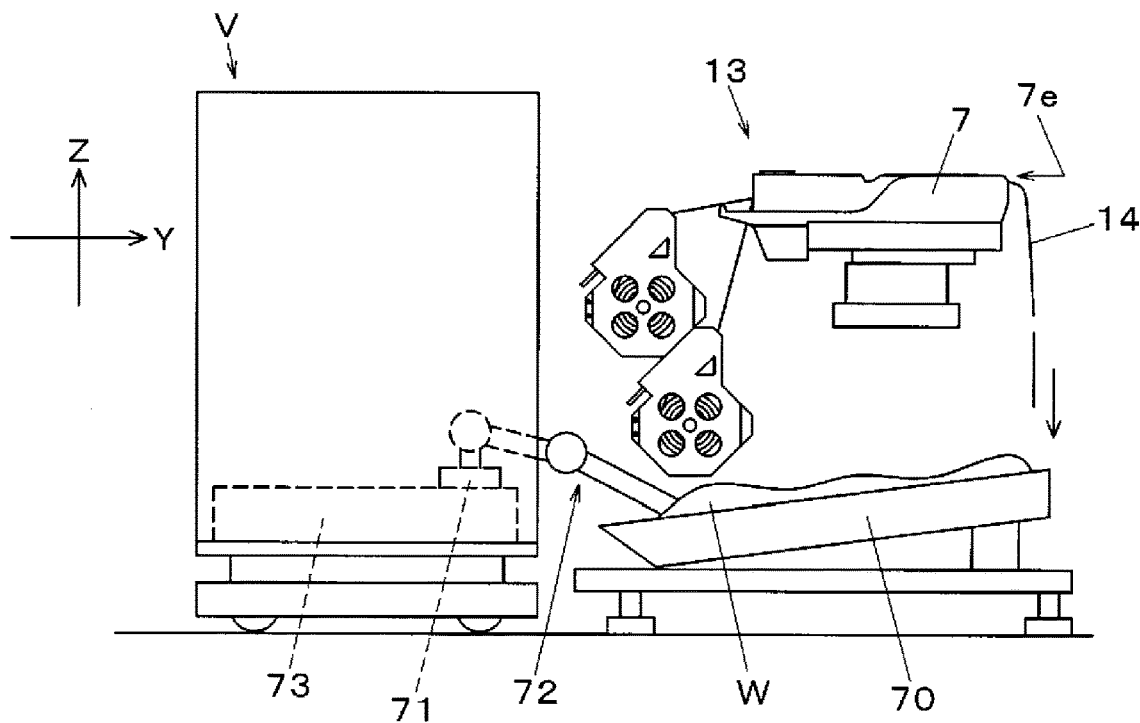
FIG. 13A is a view describing a configuration of a first example of a tape waste collector of the mobile component supply device included in the component mounting system of the embodiment of the present invention.
Figure 13B:
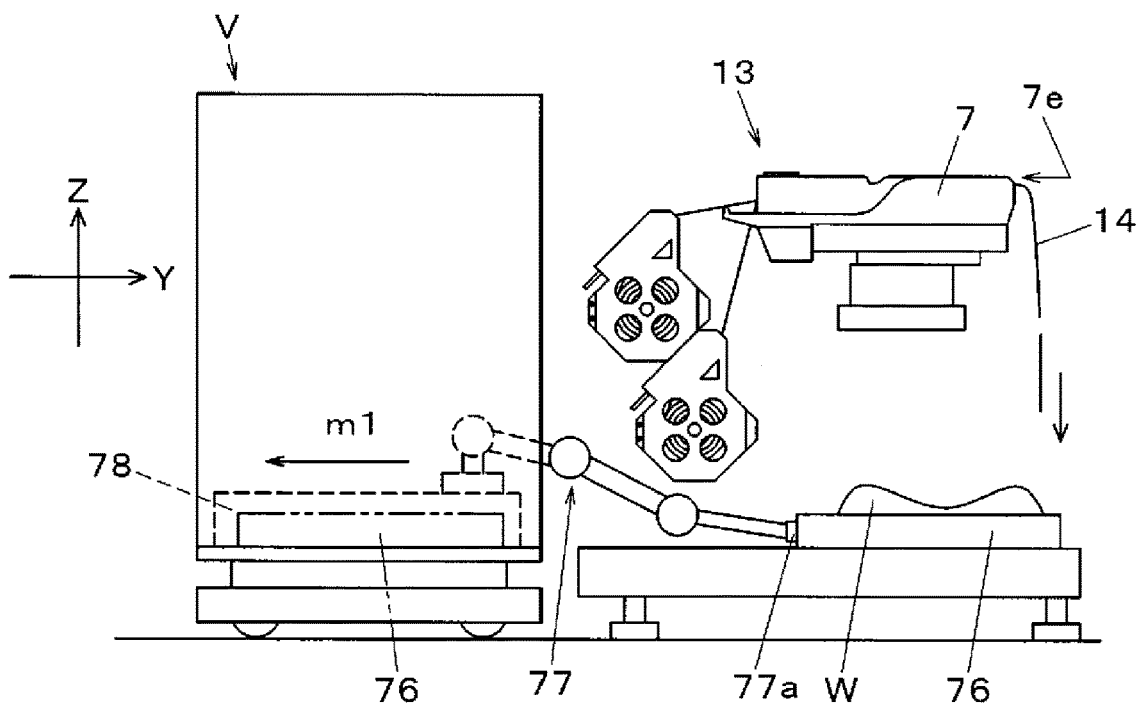
FIG. 13B is a view describing a configuration of a second example of a tape waste collector of the mobile component supply device included in the component mounting system of the embodiment of the present invention.

Next, with reference to FIGS. 13A and 13B, description will be given regarding collection of tape waste W resulted by cutting used carrier tape 14 discharged through tape discharge port 7*e* after supplying components D in tape feeder 7. First, with reference to FIG. 13A, a first example of collecting tape waste W will be described. Tape waste W resulted by being discharged through tape discharge port 7*e* and being cut into pieces having appropriate lengths is accumulated in collection container 70 fixed to carriage 13. Mobile component supply device V has suction device 71 vacuum-sucking tape waste W from collection container 70, nozzle 72 being able to move the position of the leading end and vacuum-sucking tape waste W from the leading end, and keeping box 73 keeping vacuum-sucked tape waste W.

When tape waste W is accumulated equal to or more than a-predetermined quantity in collection container 70, at timing mobile component supply device V supplies tape cassette C, the leading end of nozzle 72 is moved into collection container 70, and tape waste W is sucked by suction device 71 and is collected in keeping box 73. In this manner, suction device 71 and nozzle 72 configure waste collection, mechanism 74A (refer to FIG. 15B) collecting tape waste W from component mounters M3 to M6. That is, mobile component supply device V has waste collection mechanism 74A (tape waste collector) collecting tape waste W resulted after the component is supplied, and the tape waste collector has suction device 71 sucking tape waste W. Accordingly, tape waste W can be collected automatically without depending on a worker.

Next, with reference to FIG. 13B, a second example of collecting tape waste W will be described. The present example is different from the first example in that tape waste W is collected by movable tape waste accommodation box 76. During the component mounting work, tape waste accommodation box 76 is placed at a predetermined position of carriage 13. Mobile component supply device V has accommodation box moving device 77 such as an particulated robot having gripper 77*a* for gripping tape waste accommodation box 76, and accommodation box keeper 78 collecting tape waste accommodation box 76.

When tape waste W is accumulated equal to or mote than a predetermined quantity in tape waste accommodation box 76, at timing mobile component supply device V supplies tape cassette C, tape waste accommodation box 76 is collected in accommodation box keeper 78 by accommodation box moving device 77 (arrow m1). Empty tape waste accommodation box 76 kept in accommodation box keeper 78 in advance is placed at a predetermined position of carriage 13. In this manner, tape waste accommodation box 76, accommodation box moving device 77, and accommodation box keeper 78 configure waste collection mechanism 74B (refer to FIG. 15B) collecting tape waste W from component mounters M3 to M6.

That is, mobile component supply device V has waste collection mechanism 74B (tape waste collector) collecting tape waste W resulted after the component is supplied, and the tape waste collector has accommodation box moving device 77 (collecting device) collecting tape waste accommodation box 76 in which tape waste W is accumulated, in mobile component supply device V. Accordingly, collection of tape waste W can be realized in a short period of time. The collecting device collecting tape waste accommodation box 76 in mobile component supply device V is not limited to the articulated robot. The collecting device is acceptable as long as tape waste accommodation box 76 can be replaced between carriage 13 of component mounters M1 to M6 and mobile component supply device V. In addition, the collecting device may be disposed in component mounters M3 to M6 (carriage 13) instead of mobile component supply device V.

Next, with reference to FIGS. 14 to 15B, the configuration of a control system of component mounting system 1 will be described. Component mounting lines L1 to L3 included in component mounting system 1 have configurations similar to each other. Hereinafter, component mounting line L1 will be described. Component mounters M3 to M6 included in component mounting line L1 have configurations similar to each other. Hereinafter, component mounter M3 will be described.

Figure 14:
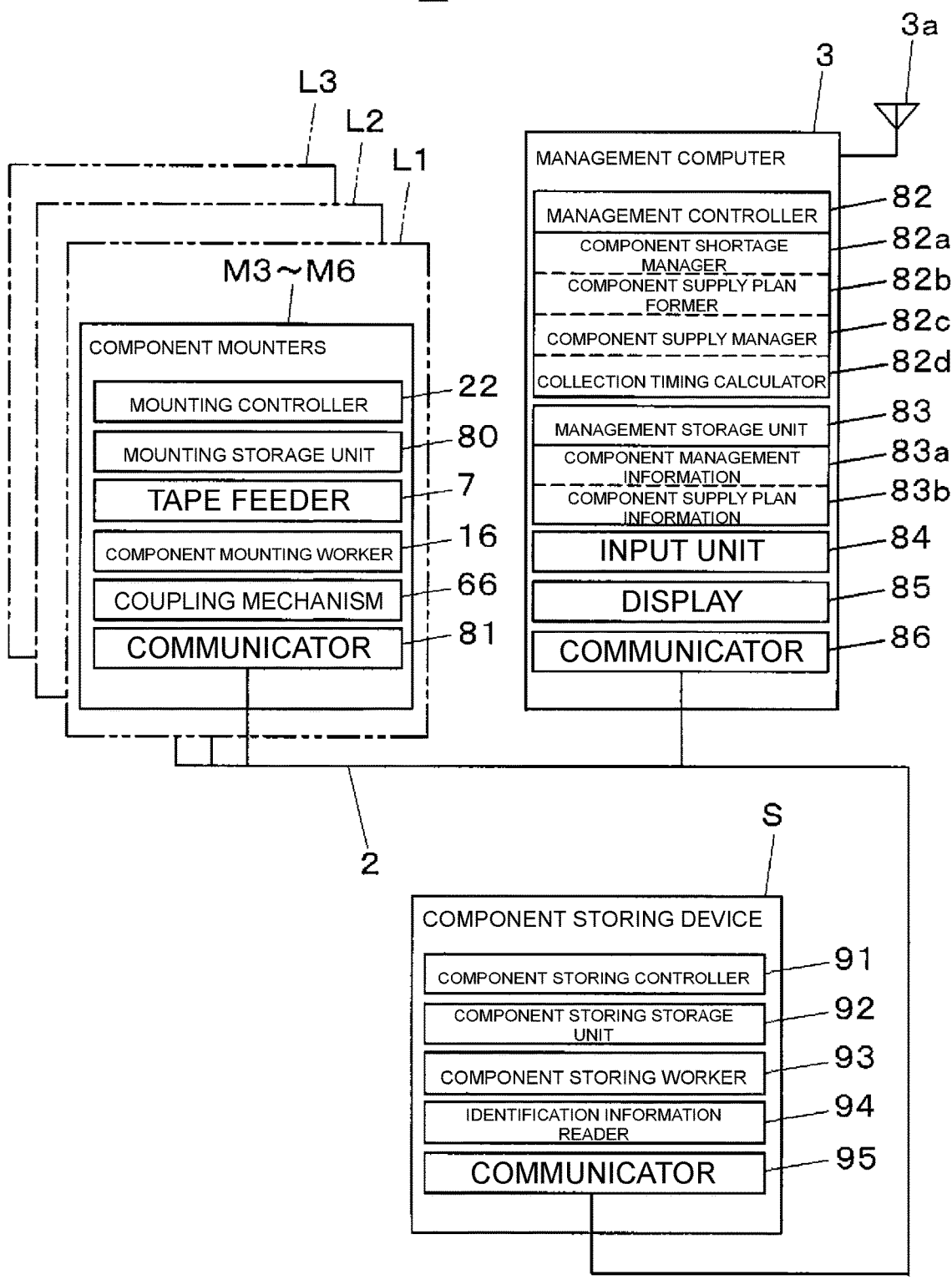
FIG. 14 is a block diagram illustrating a configuration of a control system in the component mounting system of the embodiment of the present invention.

In FIG. 14, component mounter M3 has mounting controller 22, mounting storage unit 80, tape feeder 7, component mounting worker 16, coupling mechanism 66, and communicator 81. Communicator 81 is a communication interface, and sends and receives a signal and data with respect to other component mounters M4 to M6, other component mounting lines L2 and L3, management computer 3, and component storing device S via communication network 2. Mounting controller 22 controls tape feeder 7 and component mounting worker 16 based on component mounting data stored in mounting storage unit 80, thereby executing the component mounting work performed by component mounter M3.

In addition, mounting controller 22 is interlocked while communicating with mobile component supply device V via management computer 3 and controls coupling mechanism 66, thereby executing coupling work in which coupler 63 is coupled to housing unit 52 of mobile component supply device V. In addition, mounting controller 22 successively transmits mounting circumstances including the number of consumed components D (remaining number) of component mounter M3 to management computer 3.

In FIG. 14, management computer 3 has management controller 82, management storage unit 83, input unit 84, display 85, communicator 86, and wireless communicator 3a. Input unit 84 is an input device such as a keyboard, a touch panel, and a mouse, and is used when inputting an operation command or data. Display 85 is a display device such as a liquid crystal panel and displays various pieces of information in addition to various types of screens such as an operation screen for an operation performed through input unit 84. Communicator 86 is a communication interface, and sends and receives a signal and data with respect to component mounters M3 to M6 of component mounting lines L1 to L3 and component storing device S via communication network 2. Wireless communicator 3a sends and receives a signal and data with respect to mobile component supply device V.

Management controller 82 is a computation device such as a CPU and manages component mounting system 1 based on information stored in management storage unit 83. Management controller 82 has component shortage manager 82a, component supply plan former 82b, component supply manager 82c, and collection timing calculator 82d, as an internal processing function. Management storage unit 83 is a data storage device and stores component management information 83a, component supply plan information 83b, and the like in addition to the component mounting data.

In FIG. 14, component management information 83a includes information linking identification information N of each tape cassette C and component D stored in each tape cassette C, the location of each tape cassette C, the remaining number of components D stored in each tape cassette C, an estimated time until the component is out of stock, and the like. Component storing device S, mobile component supply device V, and component mounters M3 to M6 can be the place where tape cassette C is located. In component management information 83a, in a case where tape cassette C is located in component storing device S, information specifying component storing device S thereof, and the position of the shelf where tape cassette C is to be kept are included.

In addition, in component management information 83a, in a case where tape cassette C is located in mobile component supply device V, information specifying mobile component supply device V thereof and the housing position inside housing unit 52 (supply cassette housing unit 52a and collection cassette housing unit 52b) are included. That is, management computer 3 (component information manager) stores the position and identification information N of tape cassette C (container) housed in housing unit 52 (container housing unit). In addition, in component management information 83a, in a case where tape cassette C is located in component mounters M3 to M6, information specifying component mounters M3 to M6 (also including information specifying component mounting lines L1 to L3), the position inside component supplier 6, and information of corresponding tape feeder 7 are included.

In FIG. 14, management controller 82 updates component management information 83a based on information transmitted from component storing device S, mobile component supply device V, and component mounters M3 to M6. Component shortage manager 82a estimates consumption of components D in each tape feeder 7 based on component management information 83a and the component mounting data, calculates the estimated time until the component is out of stock, and updates component management information 83a.

Component supply plan former 82b forms component supply plan information 83b including a component supply plan of supplying components D to each tape feeder 7 by using tape cassette C, based on component management information 83a and the component mounting data. Component supply plan information 83b includes the location of tape cassette C to be supplied, the position of tape feeder 7 supplying tape cassette C (positions inside component mounting lines L1 to L3, component mounters M3 to M6, and component supplier 6), information specifying mobile component supply device V which transports tape cassette C to be supplied, the moving route within floor F, and the like.

In FIG. 14, component supply manager 82c transmits an instruction related to the supplying work to component storing device S, mobile component supply device V, and component mounters M3 to M6, based on formed component supply plan information 83b. Specifically, component supply manager 82c instruct component storing device S regarding tape cassette C to be housed in mobile component supply device V. That is, management computer 3 (component information manager) transmits information of tape cassette C (container) to be supplied to component storing device S (component storage).

Component supply manager 82c instructs mobile component supply device V regarding tape cassette C to be housed, the moving route within floor F, the position of tape cassette C supplying tape feeder 7 (positions inside component mounting lines L1 to L3, component mounters M3 to M6, and component supplier 6). Component supply manager 82c instructs component mounters M3 to M6 regarding the position of tape feeder 7 supplying tape cassette C (position inside component supplier 6).

In addition, when mobile component supply device V supplies tape cassette C to tape feeder 7, component supply manager 82c receives necessary information from mobile component supply device V and tape feeder 7 and transmits an instruction to mobile component supply device V and tape feeder 7. Specifically, component supply manager 82c receives identification information N of tape cassette C read by mobile component supply device V, verifies identification information N with the information included in component supply plan information 83b, and checks whether or not the tape cassette is tape cassette C which is instructed to be supplied. That is, management computer 3 (component information manager) checks whether or not tape cassette C (container) is tape cassette C to be moved based on identification information N transmitted from mobile component supply device V.

In addition, when it is checked that tape cassette C to be supplied by mobile component supply device V is correct, component supply manager 82c transmits information of instructing tape feeder 7 to accept supplying of components D. That is, management, computer 3 (component information manager) transmits information of instructing to accept supplying of components D, to tape feeder 7 (component feeder) to be supplied components D of tape cassette C (container). In addition, when information of the state where carrier tape 14 is normally inserted is received from tape feeder 7, component supply manager 82c transmits an instruction of stopping extrusion of carrier tape 14, to mobile component supply device V.

In FIG. 14, collection timing calculator 82d calculates collection timing of tape waste W of each of component mounters M3 to M4 (or component supplier 6) based on component management information 83a, the component mounting data, and the allowable keeping capacity of tape waste W of collection container 70 or tape waste accommodation box 76. Based on a calculation result of collection timing calculator 82d, and instruction of collecting tape waste W is added to component supply plan information 83b. That is, collection timing calculator 82d calculates the collection timing of tape waste W based on component management information 83a and mounting information of component mounters M3 to M6 included in the component mounting data. In this manner, management computer 3 configures a component information manager storing and managing the information of components D.

In FIG. 14, component storing device S has component storing controller 91, component storing storage unit 92, component storing worker 93, identification information reader 94, and communicator 95. Component storing worker 93 has a transfer mechanism receiving tape cassette C or reel L (refer to FIGS. 19A and 19B) which winds and stores carrier tape 14, moving tape cassette C or reel L to the storing shelf included in component storing device S, picking up tape cassette C or reel L from the storing shelf, and relaying tape cassette C or reel L to housing unit 52 of mobile component supply device V.

Identification information reader 94 is RF reader R, a bar code reader, or the like reading identification information N of RFID 36 or a bar code applied to tape cassette C or reel L stored in component storing device S. Communicator 95 is a communication, interface, and sends and receives a signal and data with respect to management computer 3 and component mounters M3 to M6 via communication network 2. That is, component storing device S (component storage) is able to communicate with management computer 3 (component information manager). Component storing storage unit 92 stores information linking identification information N read by identification information reader 94, and the storing shelf. Various pieces of information of storing tape cassette C (component D) stored in component storing storage unit 92 is transmitted to management computer 3 via communicator 95.

Component storing controller 91 controls component storing worker 93 and identification information reader 94 to execute storing work in which tape cassette C or reel L is received, identification information N is read, and tape cassette C or reel L is stored in the storing shelf. In addition, component storing controller 91 controls component storing worker 93 based on an instruction from management computer 3, and instructed tape cassette C or reel L is picked up from the storing shelf and is relayed to mobile component supply device V. That is, component storing device S (component storage) positions tape cassette C or reel L (container) to be supplied, at a position to which cassette supply mechanism 58 and cassette collection mechanism 61 (container mover) of mobile component supply device V can move, based on information from management computer 3 (component information manager).

Figure 15A:
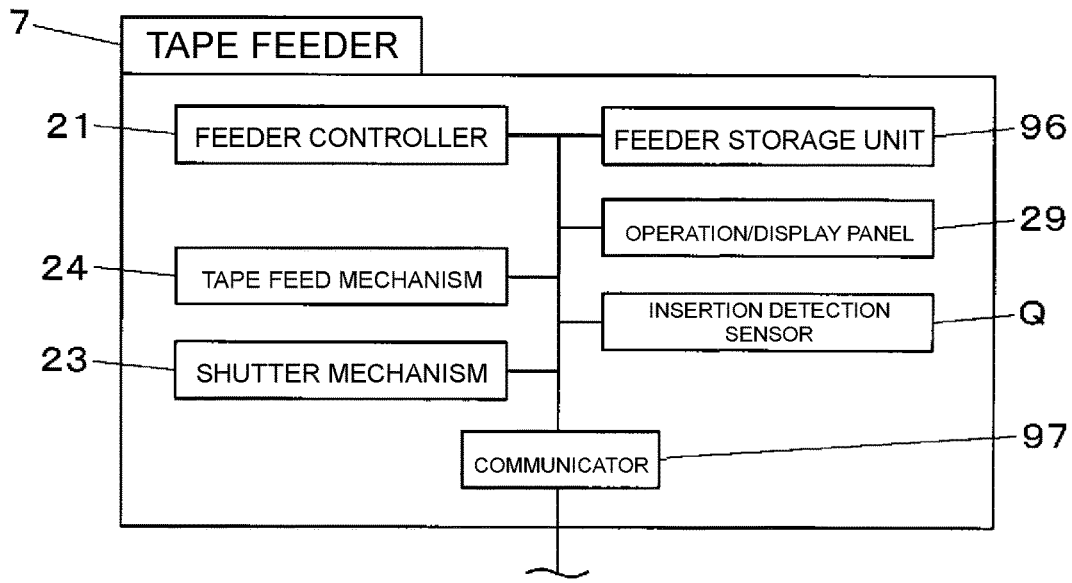
FIG. 15A is a block diagram illustrating a configuration of a control system of the tape feeder included in the component mounting system of the embodiment of the present invention.

In FIG. 15A, tape feeder 7 has feeder controller 21, feeder storage unit 96 tape feed mechanism 24, shatter mechanism 23, operation/display panel 29, insertion detection sensor Q, and communicator 97. Feeder storage unit 96 stores various pieces of information such as identification information N of tape cassette C installed in tape feeder 7, the number of consumed components D, and the remaining number. Communicator 97 is a communication interface, and sends and receives a signal and data with respect to mounting controller 22. Moreover, communicator 97 sends and receives a signal and data with respect to management computer 3 via communicator 81 of component mounters M3 to M6.

Feeder controller 21 controls tape feed mechanism 24, shutter mechanism 23, and insertion detection sensor Q, thereby transporting leading tape 14(1), inserting following tape 14(2), and executing shifting from leading tape 14(1) to following tape 14(2). In this case, feeder controller 21 opens shutter 23a when information of the state where following tape 14(2) in mobile component supply device V is prepared to be inserted is received from management computer 3.

That is, when the information of instructing tape feeder 7 to accept supplying of components D is received, tape feeder 7 (component feeder) opens shutter 23a provided in tape insertion port 7d, as an operation for accepting components D. In addition, when insertion detection sensor Q detects that leading end 14b of following tape 14(2) is inserted, feeder controller 21 transmits the situation to management computer 3. Accordingly, it is possible to prevent carrier tape 14 (component D) from being erroneously inserted in tape feeder 7 which is not a supply target.

Figure 15B:
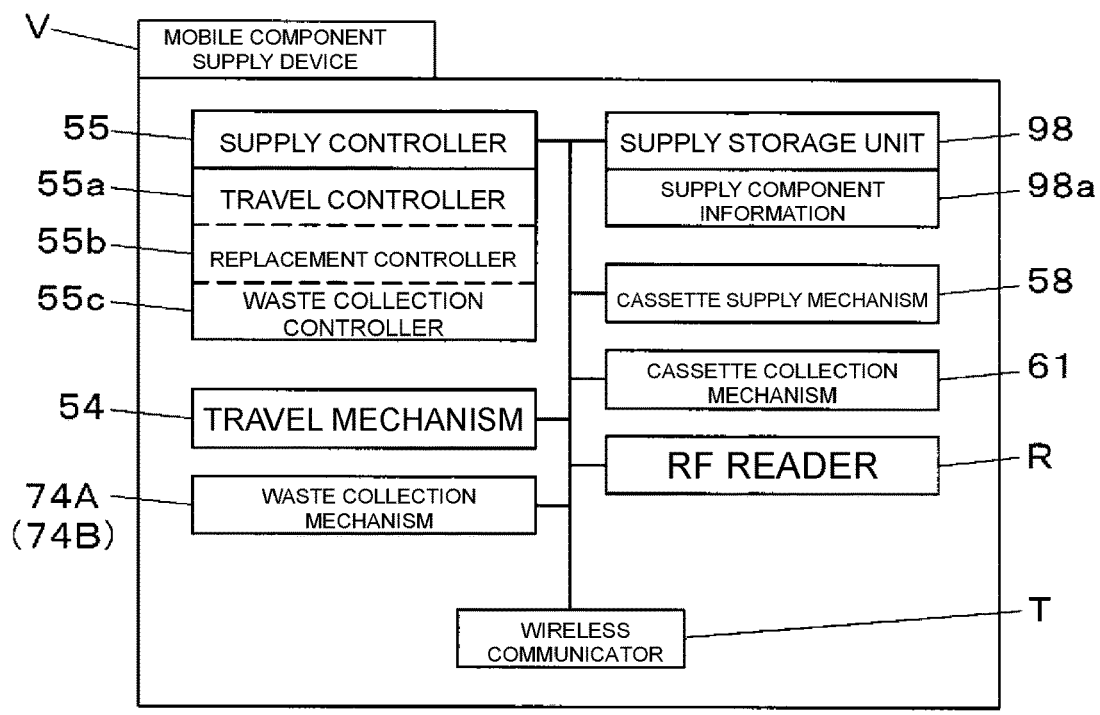
FIG. 15B is a block diagram illustrating a configuration of a control system of the mobile component supply device included in the component mounting system of the embodiment of the present invention.

In FIG. 15B, mobile component supply device V has supply controller 55, supply storage unit 98, navel mechanism 54 cassette supply mechanism 58, cassette collection mechanism 61, RF reader R, waste collection mechanism 74A (or waste collection mechanism 74B), and wireless communicator T. Wireless communicator T sends and receives a signal and data with respect to management computer 3. That is, mobile component supply device V has wireless communicator T which can perform wireless communication with management computer 3 (component information manager).

Supply storage unit 98 stores supply component information 98a and the like. Supply component information 98a includes information such as the correspondence or the supplying order of supplying tape cassette C and tape feeder 7 transmitted from management computer 3 based on component supply plan information 83b, a travelling route within floor F, and the collection timing of tape waste W, in addition to identification information N of tape cassette C housed in housing unit 52, and a position to be housed. That is, mobile component supply device V stores the position and identification information N of tape cassette C (container) housed in housing unit 52 (container housing unit). Supply controller 55 is a computation device such as a CPU and has travel controller 55a, replacement controller 55b, and waste collection controller 55c, as an internal processing function.

Travel controller 55a controls travel mechanism 54 based on supply component information 98a, causes mobile component supply device V to travel in accordance with a designated route, and stops mobile component supply device V at the stop position in front of designated component mounters M3 and M4. Replacement controller 55b controls cassette supply mechanism 58 based on supply component information 98a, receives supply target tape cassette C from component storing device S, houses supply target tape cassette C in supply cassette housing unit 52a, and supplies supply target tape cassette C to supply target tape feeder 7. In addition, replacement controller 55b controls cassette collection mechanism 61 based on supply component information 98a, collects used tape cassette C, houses used tape cassette C in collection cassette housing unit 52b, and returns collected tape cassette C to used cassette collecting device U disposed within floor F.

In addition, replacement controller 55b controls cassette supply mechanism 58 and RF reader R (information reader) and reads identification information N at least any of when tape cassette C (container) is moved from component storing device S (component storage) to supply cassette housing unit 52a (container housing unit), or after tape cassette C is moved from component storing device S to supply cassette housing unit 52a. Supply controller 55 transmits read identification information N to management computer 3. That is, mobile component supply device V transmits identification information N read by RF reader R (information reader) to management computer 3 (component information manager) via wireless communicator T.

Waste collection controller 55c controls waste collection mechanism 74A (waste collection mechanism 74B) based on supply component information 98a and collects tape waste W from component mounters M3 to M6 instructed to collect tape waste W. That is, based on the calculation result of collection timing calculator 82d of management computer 3, mobile component supply device V collects tape waste W by waste collection mechanism 74A (waste collection mechanism 74B) (tape waste collector). Waste collection controller 55c discards collected tape waste W in tape waste discarder G disposed within floor F.

Figure 16:
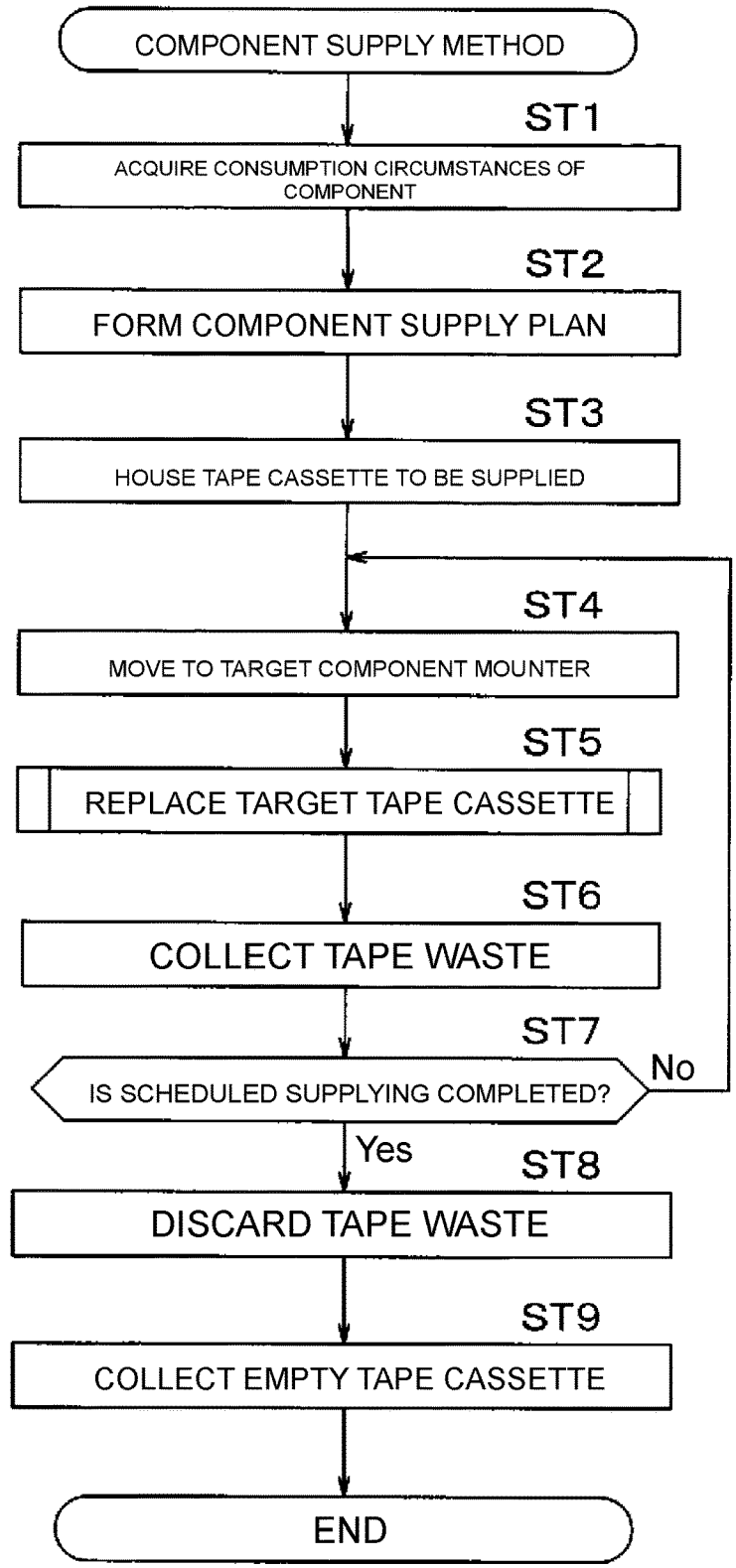
FIG. 16 is a flow chart of a component supply method in the component mounting system of the embodiment of the present invention.

Next, based on the flows in FIGS. 16 and 17, with reference to FIGS. 18A to 19B, a component supply method in component mounting system 1 will be described. In FIG. 16, management controller 82 of management computer 3 acquires information of the consumption circumstances of component D from component mounters M3 to M6 included in component mounting system 1, thereby updating component management information 83a (ST 1). Subsequently, component supply plan former 82b forms component supply plan information 83b based on updated component management information 83a and the component mounting data (ST 2: component supply plan forming step).

Subsequently, mobile component supply device V instructed by management computer 3 moves to component storing device S and receives tape cassette C supplied from component storing device S similarly instructed by management computer 3, thereby housing tape cassette C in supply cassette housing unit 52a (ST 3: supply cassette housing step). In this case, identification information N of tape cassette C is read by RF reader R included in mobile component supply device V, and read identification information N is linked with information of the housed position, thereby being transmitted to management computer 3.

In FIG. 16, mobile component supply device V moves to the stop position of supply target component mounters M3 to M6 in accordance with an instruction from the management computer 3, thereby performing preparing work for replacing tape cassette C (ST 4: replacement preparing step). In the replacement preparing step (ST 4), housing unit 52 is coupled to component mounters M3 to M6 by coupling mechanism 66.

When replacement preparation is completed, replacing work of tape cassette C starts. With reference to FIG. 17, a tape cassette replacement method in which used tape cassette C is collected and supply target tape cassette C is installed in tape feeder 7 will be described. In FIG. 17, replacement controller 55b of mobile component supply device V moves supply head 57 of cassette supply mechanism 58 to the rear of supply target tape cassette C. Subsequently, replacement controller 55b reads supply target identification information N of tape cassette C by RF reader R, thereby transmitting supply target identification information N to management computer 3. That is, mobile component supply device V transmits information indicating that components D are to be supplied to one of housed tape cassettes C (containers) to management computer 3 (component information manager).

Component supply manager 82c of management computer 3 verifies transmitted identification information N with housed component supply plan information 83b (ST 11: verifying step). From a result obtained by verifying identification information N and component supply plan 83b with each other, component supply manager 82c checks whether or not tape cassette C is the desired tape cassette (ST 12: cassette checking step). That is, mobile component supply device V transmits identification information N read by RF reader R (information reader) to management computer 3 (component information manager) via wireless communicator T, and management computer 3 checks whether or not tape cassette C (container) is tape cassette C to be moved, based on transmitted identification information N.

In a case where tape cassette C is not the desired tape cassette (No in ST 12), the situation is transmitted to management computer 3, and the component supply with respect to tape feeder 7 is skipped. The verifying step (ST 11) and the cassette checking step (ST 12) may be omitted. In such a case, in accordance with the supply order of component supply plan information 83b transmitted from management computer 3 included in supply component information 98a, when supply target tape cassette C is prepared to be supplied in mobile component supply device V, the situation (information indicating that components D are to be supplied to one of housed tape cassettes C) is transmitted to management computer 3.

Figure 17:
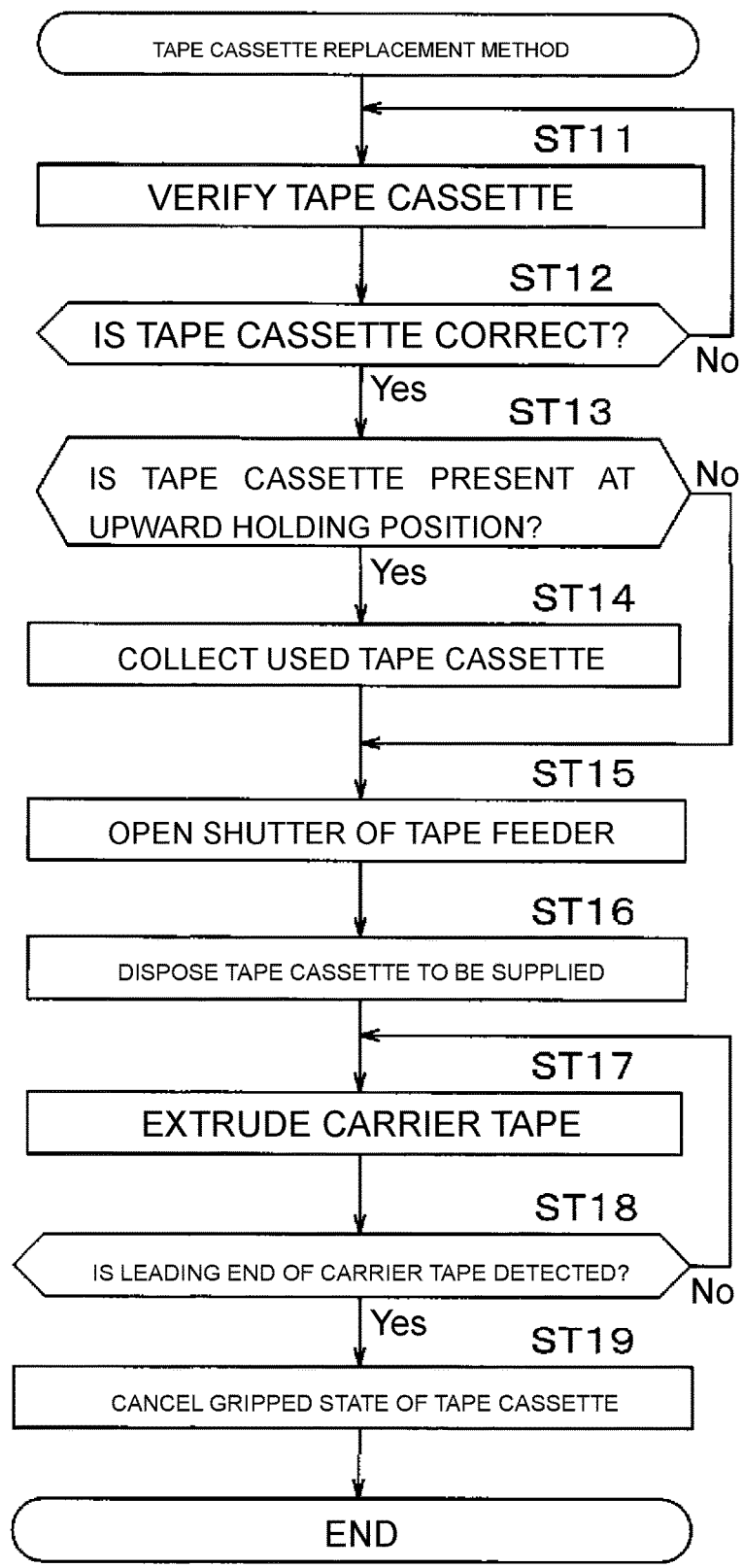
FIG. 17 is a flow chart of a tape cassette replacement method in the component mounting system of the embodiment of the present invention.

In FIG. 17, in a case where it is checked that tape cassette C is the desired tape cassette in the cassette checking step (ST 12) (Yes), component supply manager 82c checks whether or not tape cassette C is present at upward holding position Hu of collect target tape cassette C based on component management information 83a (ST 13). In a case where tape cassette C is present at upward holding position Hu (Yes in ST 13), replacement controller 55b of mobile component supply device V controls cassette collection mechanism 61 and collects used tape cassette C at downward holding position Hd (ST 14; cassette collecting step).

Figure 18A:
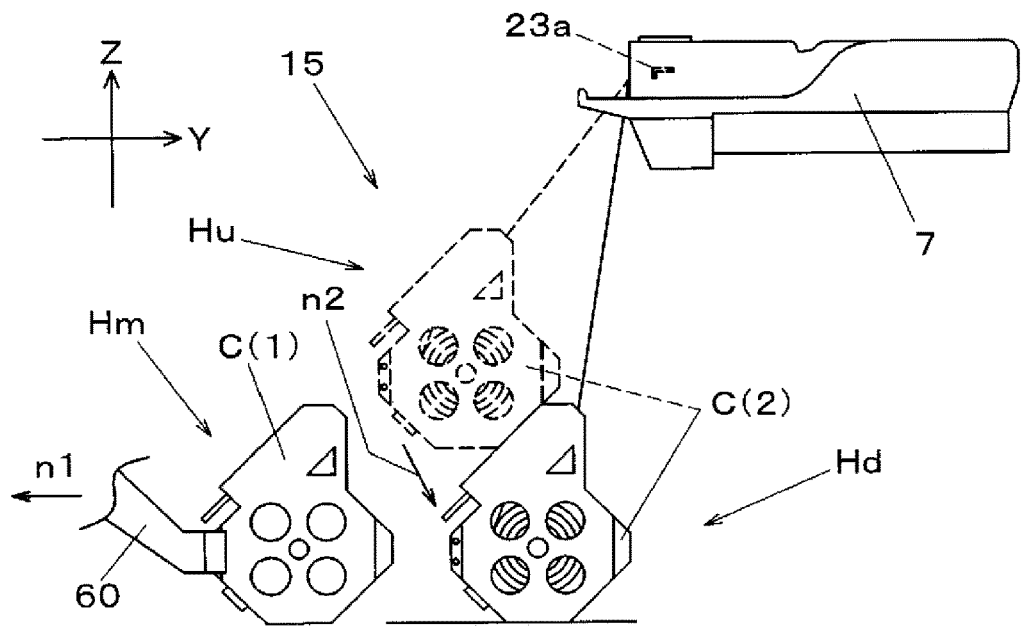
FIG. 18A is a view describing a step in which the mobile component supply device included in the component mounting system of the embodiment of the present invention replaces the tape cassette.

Here, with reference to FIG. 18A, the cassette collecting step (ST 14) performed by cassette collection mechanism 61 will be specifically described. In FIG. 18A, collecting head 60 of cassette collection mechanism 61 moves in the Y-direction from a position where tape cassette C of collection cassette housing unit 52b is not housed and is empty (empty slot) to downward movement position Hm outside. Downward movement position Hm is behind downward holding position Hd of cassette holder 15 (between cassette holder 15 and mobile component supply device V), that is, a position where collecting head 60 and gripped tape cassette C do not interfere with surrounding tape cassette C and the like when collecting head 60 in a state of gripping tape cassette C makes reciprocating movement in the X-direction.

Subsequently, at downward movement position Hm, collecting head 60 moves in the X-direction until collecting head 60 is positioned behind collect target tape cassette C(1). Subsequently, collecting head 60 moves in the Y-direction toward cassette holder 15 and grips tape cassette C(1) at downward holding position Hd. Subsequently, collecting bead 60 gripping tape cassette C(1) moves in the Y-direction to downward movement position Hm (arrow n1). When tape cassette C(1) is collected from downward holding position Hd, tape cassette C(2) at upward holding position Hu moves to downward holding position Hd (arrow n2).

Subsequently, collecting head 60 gripping tape cassette C(1) moves in the X-direction to the front of the empty slot of collection cassette housing unit 52b at downward movement position Hm. Subsequently, collecting head 60 gripping tape cassette C(1) moves in the Y-direction, and tape cassette C(1) is placed in the empty slot of collection cassette housing unit 52b, thereby releasing the gripping state.

In FIG. 17, subsequently, feeder controller 21 of tape feeder 7 opens shutter 23a in accordance with an instruction from management computer 3 (ST 15: shutter opening step). In FIG. 15B, shutter 23a of tape feeder 7 is opened (arrow n3).

In FIG. 17, in a case where tape cassette C is not present at upward holding position Hu (No in ST 13), only one tape cassette C is present in cassette holder 15. Therefore, the shutter opening step (ST 15) is executed without collecting tape cassette C at downward holding position Hd. In this manner, management computer 3 (component information manager) transmits information of instructing target tape feeder 7 (component feeder) supplying components D of tape cassette C(3) (container) to accept supplying of components D, and tape feeder 7 executes the operation (ST 15) for accepting components D when the information of instructing target tape feeder 7 to accept supplying of components D is received.

In FIG. 17, subsequently, replacement controller 55b of mobile component supply device V controls cassette supply mechanism 58 and moves supply target tape cassette C(3) to supply position Hs of supply target tape feeder 7 (ST 16). Specifically, in supply cassette housing unit 52a, supply bead 57 grips supply target tape cassette C(3) and moves supply target tape cassette C(3) in the Y-direction to the front of supply position Hs (refer to FIG. 18B). Subsequently, supply bead 57 gripping tape cassette C(3) moves in the X-direction until supply bead 57 is positioned behind supply target tape feeder 7 in supply position Hs. In this manner, supply target tape cassette C(3) moves to supply position Hs behind supply target tape feeder 7.

Subsequently, replacement controller 55b controls cassette supply mechanism 58, extrudes carrier tape 14(3) from tape cassette C(3), and inserts leading end 14b of carrier tape 14(3) through tape insertion port 7d of tape feeder 7 (ST 17). Thereafter, until insertion detection sensor Q of tape feeder 7 detects leading end 14b of carrier tape 14(3) (Yes in ST 18), extrusion of the carrier tape (ST 17) is continuously performed, and carrier tape 14(3) is continuously extruded (No in ST 18).

Figure 18B:
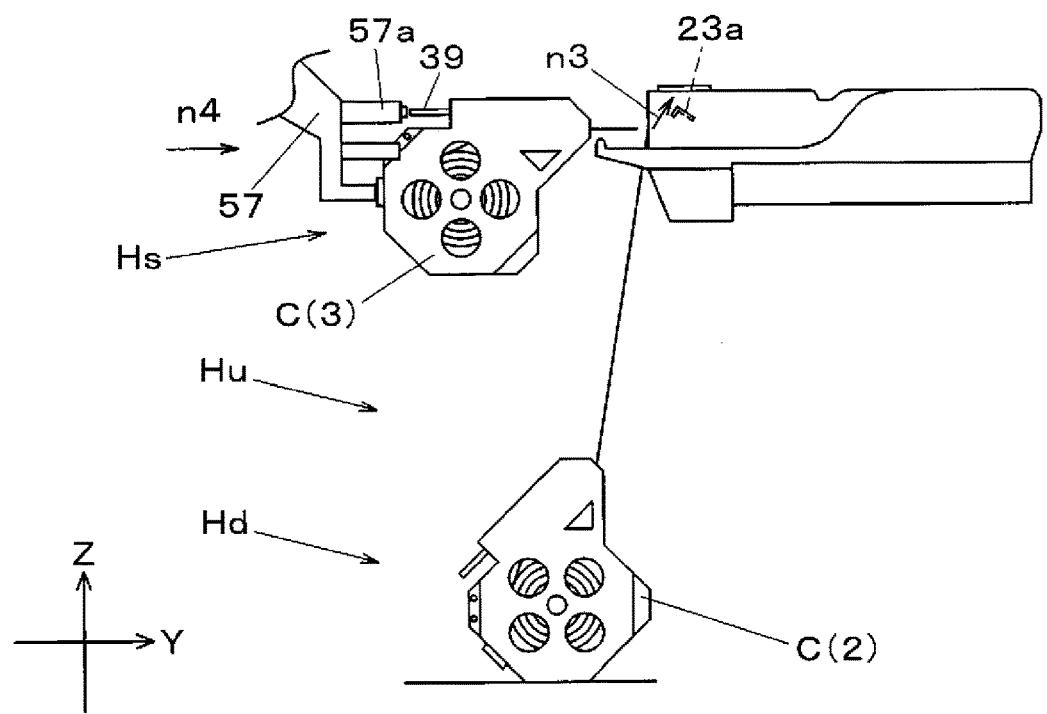
FIG. 18B is another view describing the step in which the mobile component supply device included in the component mounting system of the embodiment of the present invention replaces the tape cassette.

In FIG. 18B, supply head 57 grips tape cassette C(3) and moves tape cassette C(3) to supply position Hs (arrow n4). Thereafter, in FIG. 19A, tape inserter 57a pushes extrusion rod 39 of tape cassette C(3) into tape cassette C(3) (arrow n5), extrudes carrier tape 14(3) toward tape feeder 7, and inserts carrier tape 14(3) through tape insertion port 7d of tape feeder 7 (arrow n6). That is, mobile component supply device V has tape Inserter 57a inserting and pushing leading end 14b of carrier tape 14(3) stored in tape cassette C(3) (container) into tape insertion port 7d of tape feeder 7 (auto-loading feeder).

Figure 19A:
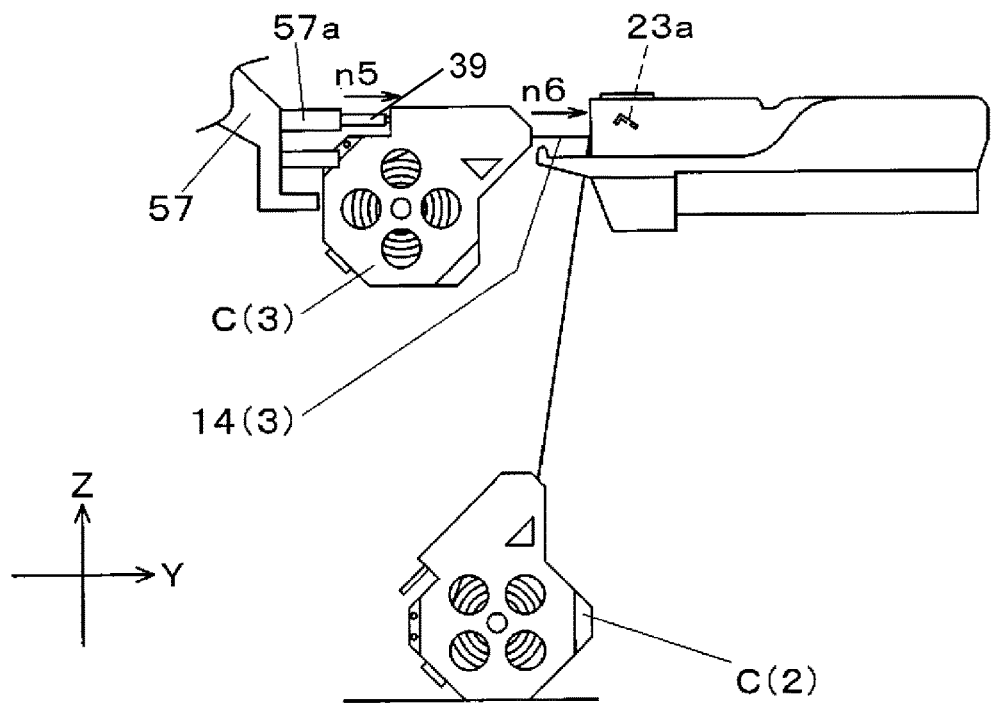
FIG. 19A is further another view describing the step in which the mobile component supply device included in the component mounting system of the embodiment of the present invention replaces the tape cassette.

In FIG. 19A, tape inserter 57a pushes push-in rod 39 (carrier tape extrusion member) into tape cassette C(3) (container), thereby extruding carrier tape 14(3) from tape cassette C(3). Leading end 14b of carrier tape 14(3) inserted through tape insertion port 7d of tape feeder 7 arrives at insertion detection sensor Q (refer to FIG. 5). When leading end 14b is detected by insertion detection sensor Q, the situation is transmitted to management computer 3, and management computer 3 instructs mobile component supply device V to end extrusion of carrier tape 14(3). That is, when it is detected that carrier tape 14(3) is normally inserted, insertion detection sensor Q (tape insertion detector) notifies mobile component supply device V of the situation and tape inserter 57a steps pushing carrier tape 14(3).

In FIG. 17, when extrusion of carrier tape 14(3) is completed (Yes in ST 18), replacement controller 55b controls cassette supply mechanism 58, the gripped state of tape cassette C(3) is released (ST 19: grip releasing step), and supply head 57 moves into supply cassette housing unit 52a.

Figure 19B:
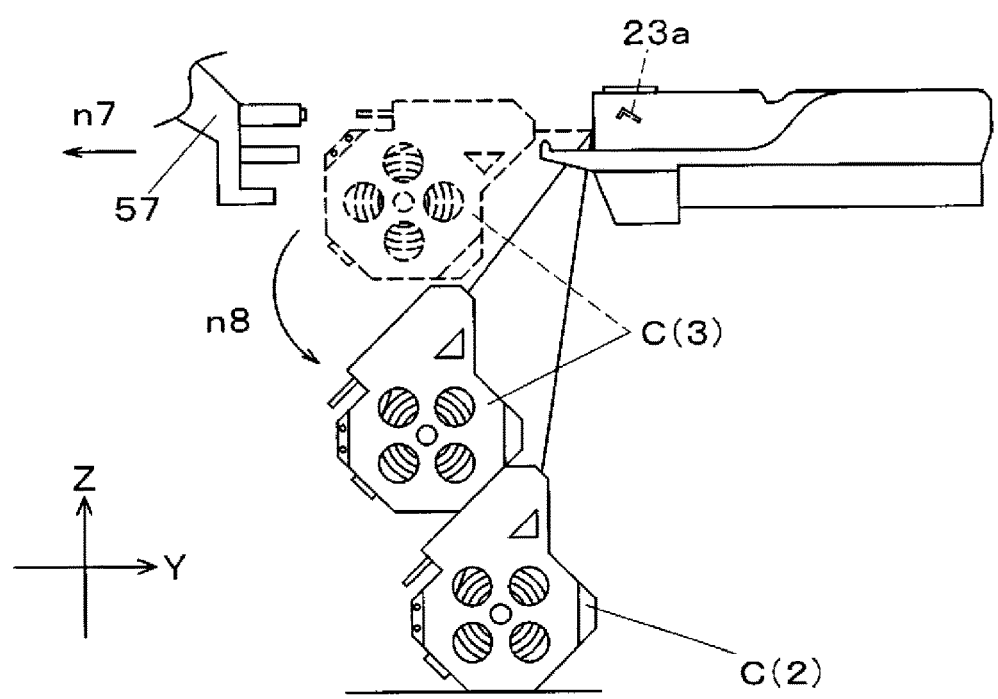
FIG. 19B is still another view describing the step in which the mobile component supply device included in the component mounting system of the embodiment of the present invention replaces the tape cassette.

Specifically, in FIG. 19B, tape cassette C(3) in which the gripped state is released moves slightly behind supply position Hs (arrow n7) and moves in the X-direction to the front of the empty slot (for example, the slot in which supplied tape cassette C(3) is housed) of supply cassette housing unit 52a. Subsequently, supply head 57 moves in the Y-direction and moves into supply cassette housing unit 52a. Tape cassette C(3) in which the gripped state is released moves from supply position Hs to upward holding position Hu (arrow n8).

As described above, the steps from the shutter opening step (ST 15) to the grip releasing step (ST 19) becomes a cassette supplying step in which supply target tape cassette C(3) is supplied by mobile component supply device V. In this manner, cassette supply mechanism 58 and cassette collection mechanism 61 (container mover) move supplying tape cassette C(3) (container) from supply cassette housing unit 52a (first area) to upward holding position Hu (first holding position) and move used tape cassette C(1) (container) from downward holding position Hd (second holding position) to collection cassette housing unit 52b (second area).

In FIG. 16, when a cassette replacing step (ST 5) in coupled component mounters M3 to M6 ends, waste collection controller 55c of mobile component supply device V controls waste collection mechanism 74A (waste collection mechanism 74B) and collects tape waste W based on the calculation result of collection timing calculator 82d of management computer 3 (ST 6: tape waste collecting step). Subsequently, component supply manager 82c of management computer 3 or supply controller 55 of mobile component supply device V determines whether or not scheduled supplying is completed (ST 7). In a case where supplying is not completed (No in ST 7), mobile component supply device V moves to component mounters M3 to M6 which becomes the next supply target thereby executing the steps from replacement preparing step (ST 4) to the tape waste collecting step (ST 6).

In a case where supplying of tape cassettes C (components D) is completed in scheduled component mounters M3 to M6 (Yes in ST 7), mobile component supply device V moves to tape waste discarder G and discards collected tape waste W (ST 8). Subsequently, mobile component supply device V moves to used cassette collecting device U and relays used tape cassette C housed in collection cassette housing unit 52b to used cassette collecting device U.

As described above, component mounting system 1 of the present embodiment includes component mounters M3 to M6 that mounts component D on board B; tape feeder 7 (component feeder) that is placed in component mounters M3 to M6 and supplies component D; and mobile component supply device V that holds tape cassette C (container) storing component D, automatically moves, and supplies components D of carrier tape 14 wound and stored in tape cassette C to tape feeder 7. Accordingly, component D can be automatically picked up from component storing device S (component storage) and can be supplied to component mounters M3 to M6.

Figure 20A:
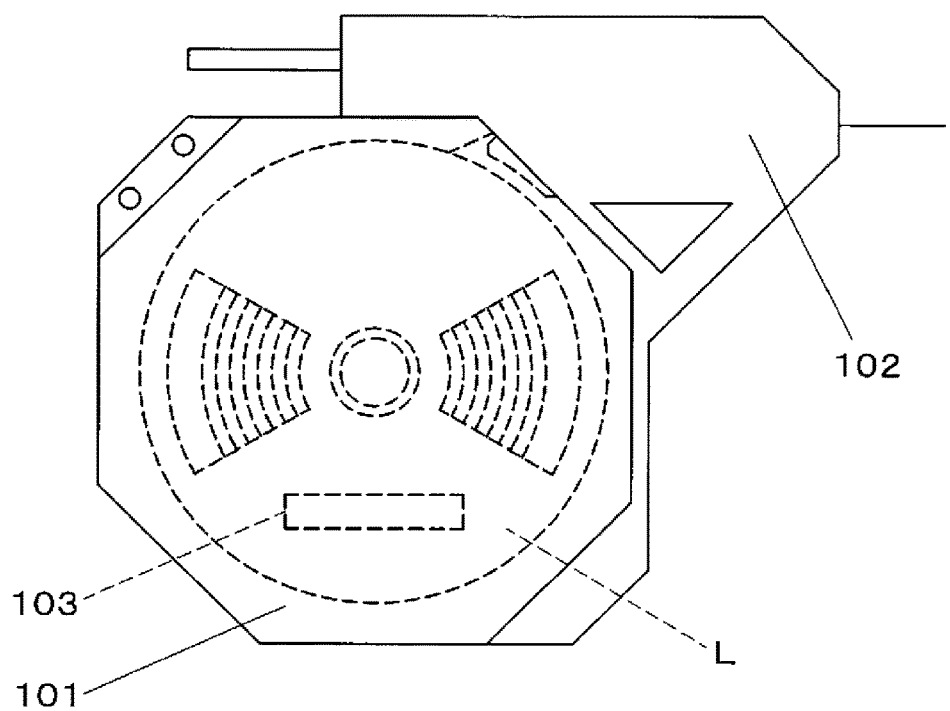
FIG. 20A is a view describing a configuration of a state where the cover is installed in a tape cassette of the second example included in the component mounting system of the embodiment of the present invention.
Figure 20B:
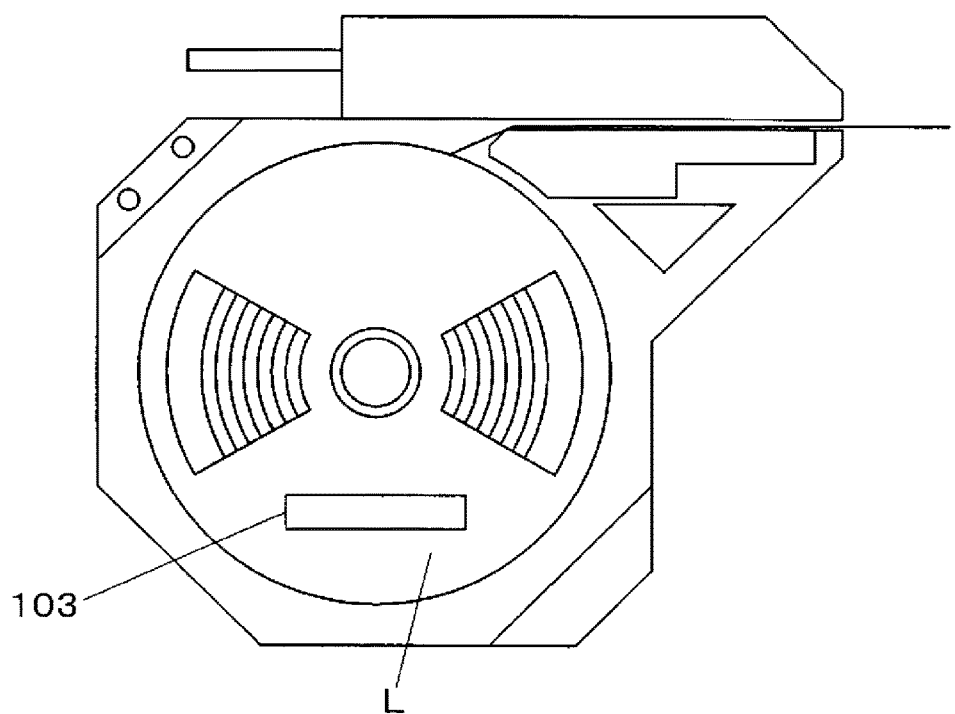
FIG. 20B is a view describing a configuration of a state where the cover is removed from the tape cassette of the second example included in the component mounting system of the embodiment of the present invention.

Next, with reference to FIGS. 20A and 20B, the second example of tape cassette C1 in which carrier tape 14 is wound, stored, and supplied to tape feeder 7 will be described. Hereinafter, the same reference marks are applied to the same configurations as those of the first example illustrated in FIGS. 6A to 7C, and the detailed description will be omitted. Tape cassette C1 of the second example is different from that of the first example in that reel L winding and storing carrier tape 14 is housed inside. FIG. 20A illustrates a state where transparent cover 101 and opaque cover 102 are installed in tape cassette C1, and FIG. 20B illustrates a state where transparent cover 101 and opaque cover 102 are removed.

In FIG. 20A, on the front surface of reel L housed in tape cassette C1, transparent cover 101 such as an acrylic plate is installed. On the front surface of tape extrusion mechanism 33, opaque cover 102 such as a metal plate is installed. On the side surface of reel L, bar code 103 is applied, and bar code 103 can be read through transparent cover 101. That is, in tape cassette C1, in a state where transparent cover 101 and opaque cover 102 are installed, when the bar code reader reads bar code 103, identification information N can be thereby read. Tape cassette C1 houses carrier tape 14 in tape cassette C1 in a state of reel L as delivered from a manufacturer and can thereby reduce the man-hour in transfer of carrier tape 14.

Next, with reference to FIGS. 21 and 22, the second example of mobile component supply device V1 and carriage 110 will be described. Hereinafter, the same reference marks are applied to the same configurations as those of the first example illustrated in FIGS. 10 and 11, and the detailed description will be omitted. Mobile component supply device V1 and carriage 110 of the second example are different from those of the first example in that replacement of tape cassette C is executed without coupling housing unit 52 to carriage 110.

Figure 21:
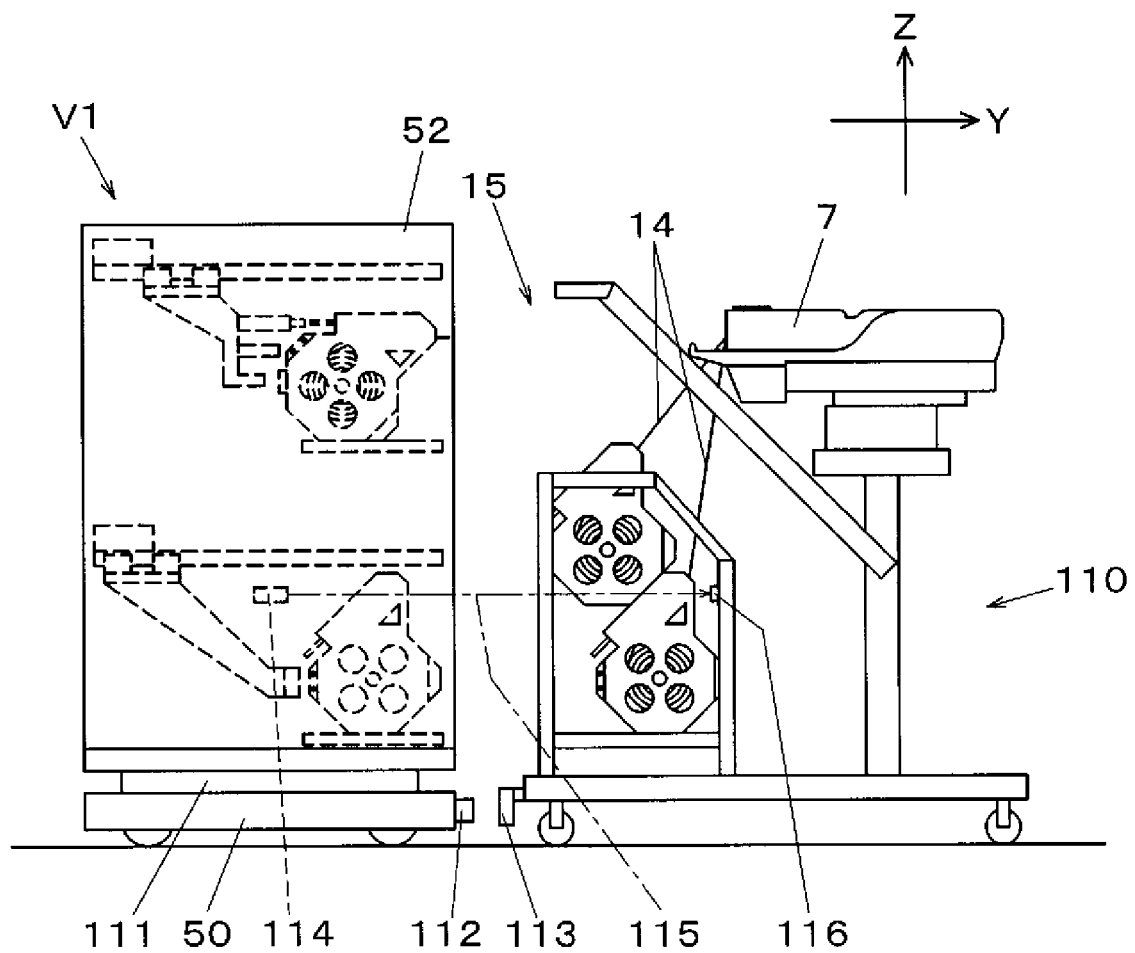
FIG. 21 is a view describing a configuration of a mobile component supply device and a carriage of the second example included in the component mounting system of the embodiment of the present invention.

In FIG. 21, mobile component supply device V1 is configured by stacking carriage 50, support device 111, and housing unit 52 from below. The bottom of support device 111 is fixed to carriage 50 and the top is fixed to housing unit 52, thereby supporting housing unit 52 from below. In support device 111, a slider and a motor moving the top in the horizontal direction (X-direction and Y-direction) and the vertical direction (Z-direction) with respect to the bottom are built in, and the motor is controlled to be driven by supply controller 55, thereby moving housing unit 52.

Figure 22:
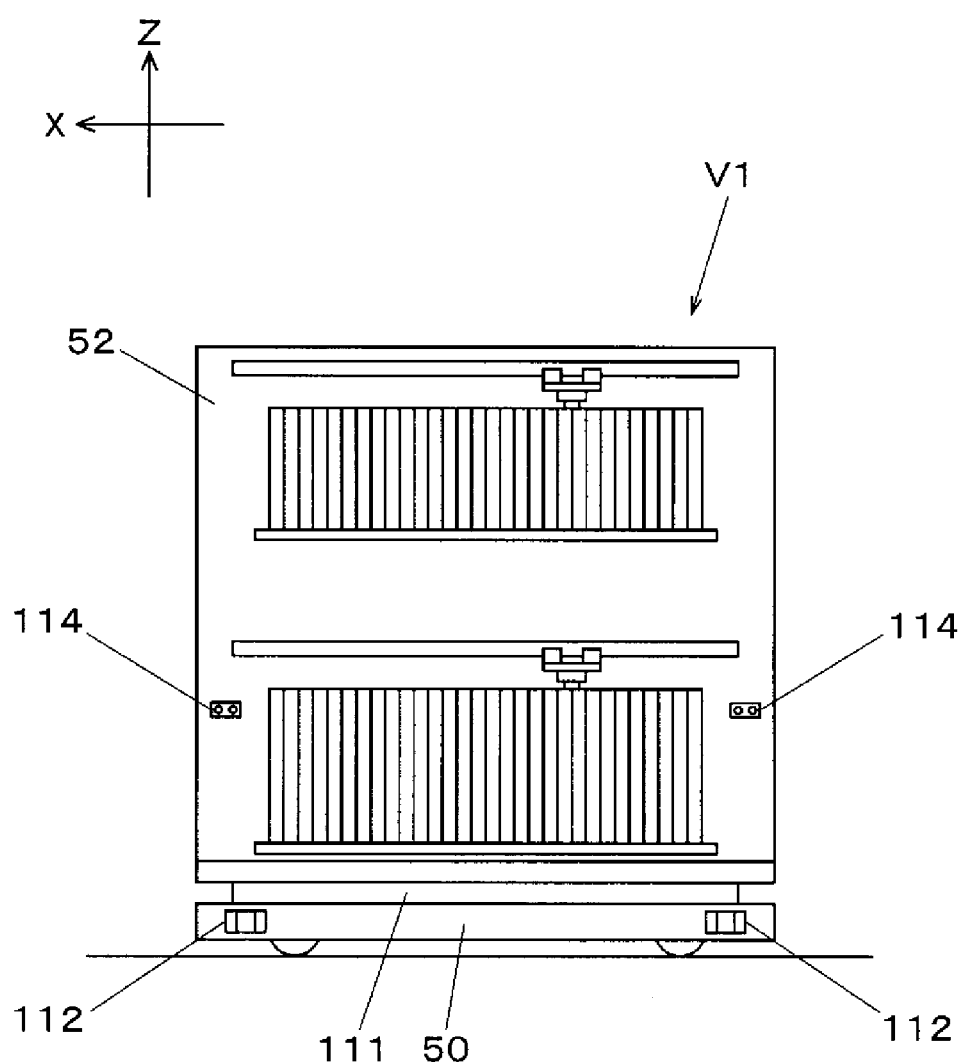
FIG. 22 is a view describing a configuration of the mobile component supply device of the second example included in the component mounting system of the embodiment of the present invention.

In FIG. 22, in carriage 50, at positions facing carriage 110 when tape cassette C is replaced, there are provided two shade sensors 112. In FIG. 21, in carriage 110, at positions facing carriage 50 when tape cassette C is replaced, there are provided two dogs 113 shading shade sensor 112. When tape cassette C is replaced, dogs 113 respectively shade sensors 112. The detection results of shade sensors 112 are sent to supply controller 55.

In FIG. 22, in housing unit 52, at positions facing carriage 110 illustrated in FIG. 21, when tape cassette C is replaced, there are provided two laser displacement sensors 114. In FIG. 21, in carriage 110, at positions facing housing unit 52 when tape cassette C is replaced, there are provided two targets 116 reflecting laser beam 115 emitted from laser displacement sensor 114. When tape cassette C is replaced, the position of housing unit 52 with respect to carriage 110 is measured by returned laser beam 115 which is emitted to target 116 by laser displacement sensor 114. The measurement result is sent to supply controller 55.

Next, the replacement preparing step (ST 4) in mobile component supply device V1 will be described. First, mobile component supply device V1 moves to the trout of carriage 110 where tape feeder 7 which becomes the supply target is placed. Thereafter, until shade sensor 112 detects shading, mobile component supply device V1 moves in a direction of carriage 110 (Y-direction) at low speed. Accordingly, rough positioning of mobile component supply device V1 with respect to carriage 110 is completed. The position becomes the stop position. Subsequently, the position of housing unit 52 with respect to carriage 110 is measured by laser displacement sensor 114, and based on the measurement result, supply controller 55 controls support device 111 and precisely performs positioning of mobile component supply device V1 with respect to carriage 110.

In this manner, mobile component supply device V1 includes carriage 50 (traveller) having housing unit 52 (container housing unit) on the top and moving or stopping automatically, and position measurers (shade sensor 112 and laser displacement sensor 114) measuring positions with respect to component mounters M3 to M6. When tape cassette C (container) is moved between housing unit 52 and cassette holder 15 (container holding device) by the container mover (cassette supply mechanism 58 and cassette collection mechanism 61), carriage 50 stops mobile component supply device V1 at a predetermined stop position with respect to component mounters M3 to M6 based on the measurement results of the position measurers.

In addition, supply controller 55 monitors the measurement result of laser displacement sensor 114 even while tape cassette C is replaced. When housing unit 52 leaves the stop position due to a worker hitting mobile component supply device V1, the replacing work is suspended. Then, carriage 50 and support device 111 are controlled and are positioned at the stop position. That is, when mobile component supply device V1 leaves the stop position, the container mover suspends movement of tape cassette C (container), and carriage 50 (traveller) and support device 111 are corrected such that the position of mobile component supply device V1 becomes the stop position. In this manner, since carriage 110 does not require coupler 63, the structure of carriage 110 becomes simple.

Figure 23:
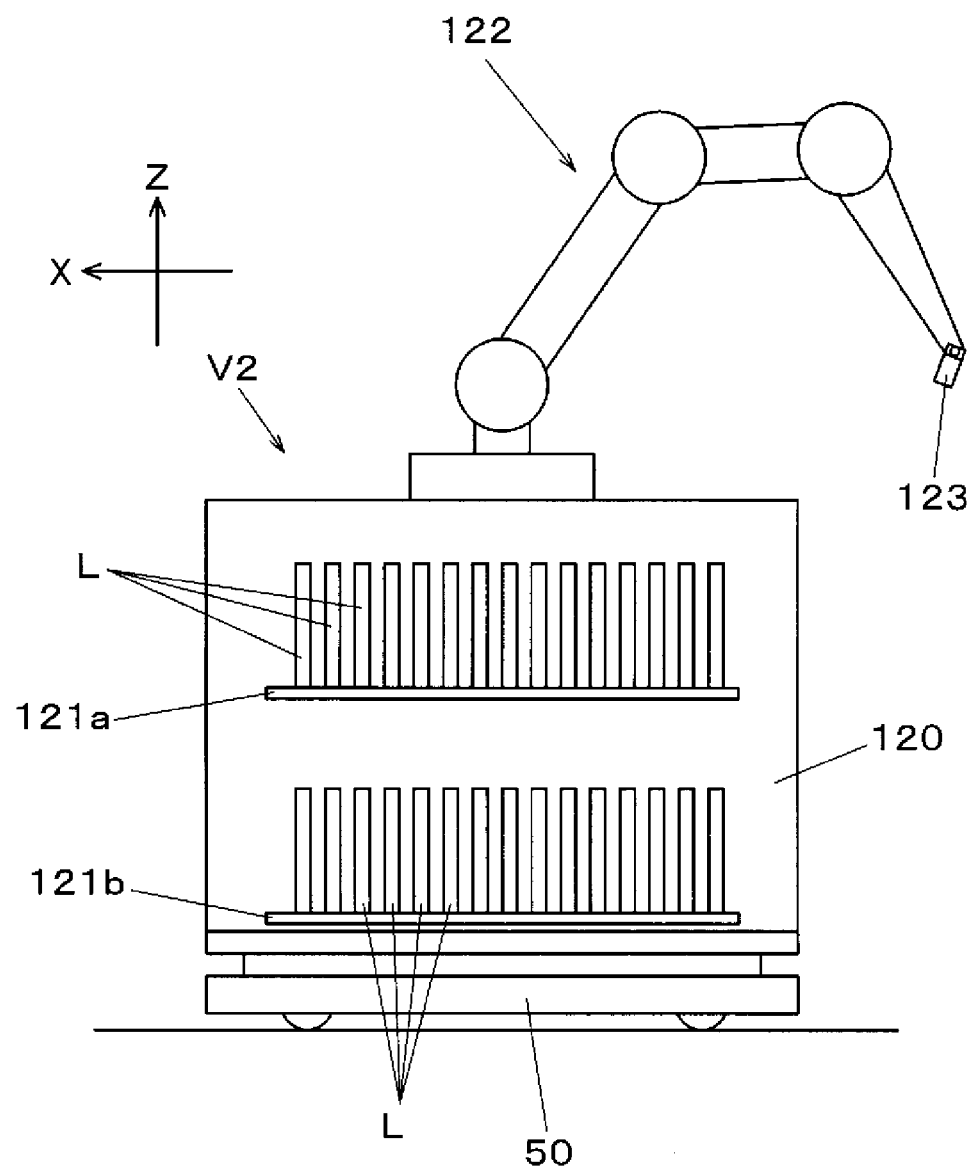
FIG. 23 is a view describing a configuration of a mobile component supply device of a third example included in the component mounting system of the embodiment of the present invention.

Next, with reference to FIG. 23, a third example of mobile component supply device V2 will be described. Hereinafter, the same reference marks are applied to the same configurations as those of the first example illustrated in FIGS. 10 and 11, and the detailed description will be omitted. Mobile component supply device V2 of the third example is different from that of the first example in that reel L (container) is supplied and collected instead of tape cassette C, and the container mover is an articulated robot.

Mobile component supply device V2 is configured by stacking carriage 50 and housing unit 120 from below. Housing unit 120 is fixed to carriage 50. In housing unit 120, there are provided supply reel housing shelf 121a housing reel L to be supplied, and collection reel housing shelf 121b housing collected reel L on the top and bottom. In addition, on the top of housing unit 120, there is provided articulated robot 122. At leading end 123 of articulated robot 122, there are provided a grip device gripping reel L; a camera or a sensor recognizing the positional information of leading end 123 of articulated robot 122, recognizing tape insertion port 7d of tape feeder 7, or the like, and an inserting device (tape inserter) inserting carrier tape 14 wound and stored in reel L through tape insertion port 7d.

When mobile component supply device V2 replaces reel L, mobile component supply device V2 moves to the front surface of component mounters M3 to M6 which becomes a target, recognizes a positioning mark (not illustrated) provided in a component mounter body or carriage 131 (described below) illustrated in FIG. 24, by articulated robot 122 and leading end 123, thereby recognizing the positional information of articulated robot 122 and leading end 123. Subsequently, by articulated robot 122 and leading end 123, reel L to be supplied is picked up from supply reel housing shelf 121a and is placed in cassette holder 15. Then, tape insertion port 7d of tape feeder 7 recognized by the camera, and carrier tape 14 is inserted through tape insertion port 7d. In addition, by articulated robot 122 and leading end 123, used reel L is collected from cassette holder 15 and is placed in collection reel housing shelf 121b.

Mobile component supply device V2 recognizes the position of the component mounter body or carriage 131 by the camera or the sensor provided at leading end 123, thereby making a correction. Moreover, the position of reel L gripped by articulated robot 122 and leading end 123, the position of tape feeder 7, and the like are recognized, and mobile component supply device V2 recognizes the positional relationship between itself and carriage 131 and makes a correction. Therefore, mobile component supply device V2 and carriage 131 can be positioned without being mechanically coupled to each other. The positioning mark may not be carriage 131 and may be provided in the component mounter body to which carriage 131 is coupled. Here, the camera or the sensor provided at leading end 123 configures a recognizer recognizing the positioning mark provided in component mounters M3 to M6 (also including carriage 131).

In the present example, in housing unit 120, supply reel housing shelf 121a and collection reel housing shelf 121b are disposed on the top and the bottom. However, disposition of the shelves is not limited thereto. In each of the shelves, a supply reel and a collection reel may be able to be nakedly disposed, or the housing shelves may be provided such that the supply reel and the collection reel are mixedly disposed in only any one stage of the top and the bottom.

In the present embodiment, the component storage storing the container (tape cassette C and reel L) is not limited to component storing device S. A worker may read identification information M of the container through a portable terminal which can communicate with management computer 3, may keep identification information N in a component stockroom (component storage), may pick up the container in accordance with an instruction transmitted from management computer 3 to the portable terminal, and may house the container in mobile component supply device V.

In the present embodiment, the container (tape cassette C and reel L) storing components D is supplied and collected with respect to the component feeder (tape feeder 7) placed in component mounters M3 to M6. However, without being limited thereto, a component feeder itself in which components B (carrier tape 14) are built in (hereinafter, will be referred to as "built-in type tape feeder 130 (refer to FIG. 24)") may be supplied and collected with respect to component mounters M3 and M4 by mobile component supply device V. In addition, a reel holder holding reel L may be included, and the reel holder may be supplied and collected by the component feeder which can move integrally with carrier tape 14 (component D) wound and stored in reel L.

Hereinafter, by using FIGS. 24 to 27, based on the example of built-in type tape feeder 130, the configuration of mobile component supply device V supplying and collecting the component feeder with respect to component mounters M3 to M6, and the operation of supplying and collecting will be described. The basic operation and configuration are substantially similar to those in the case of tape cassette C. Therefore, description will be given regarding only the parts of positioning of mobile component supply device V and the operation of supplying and collecting built-in type tape feeder 130 with respect to component mounters M3 to M6.

First with reference to FIGS. 24 and 25, a fourth example of mobile component supply device V3 and carriage 131 supplying and collecting built-in type tape feeder 130 will be described. Hereinafter, the same reference marks are applied to the same configurations as those of the first example illustrated in FIGS. 10 and 11, and the detailed description will be omitted. On the top of carriage 131, plurality of built-in type tape feeders 130 are installed so as to be able to be attached and detached in parallel in the X-direction. On the front surface of built-in type tape feeder 130 (surface outside in a state of being installed in component mounters M3 to M6), there is provided gripper 130a. In carriage 131, in front of built-in type tape feeder 130, there is provided coupler 63.

Figure 24:
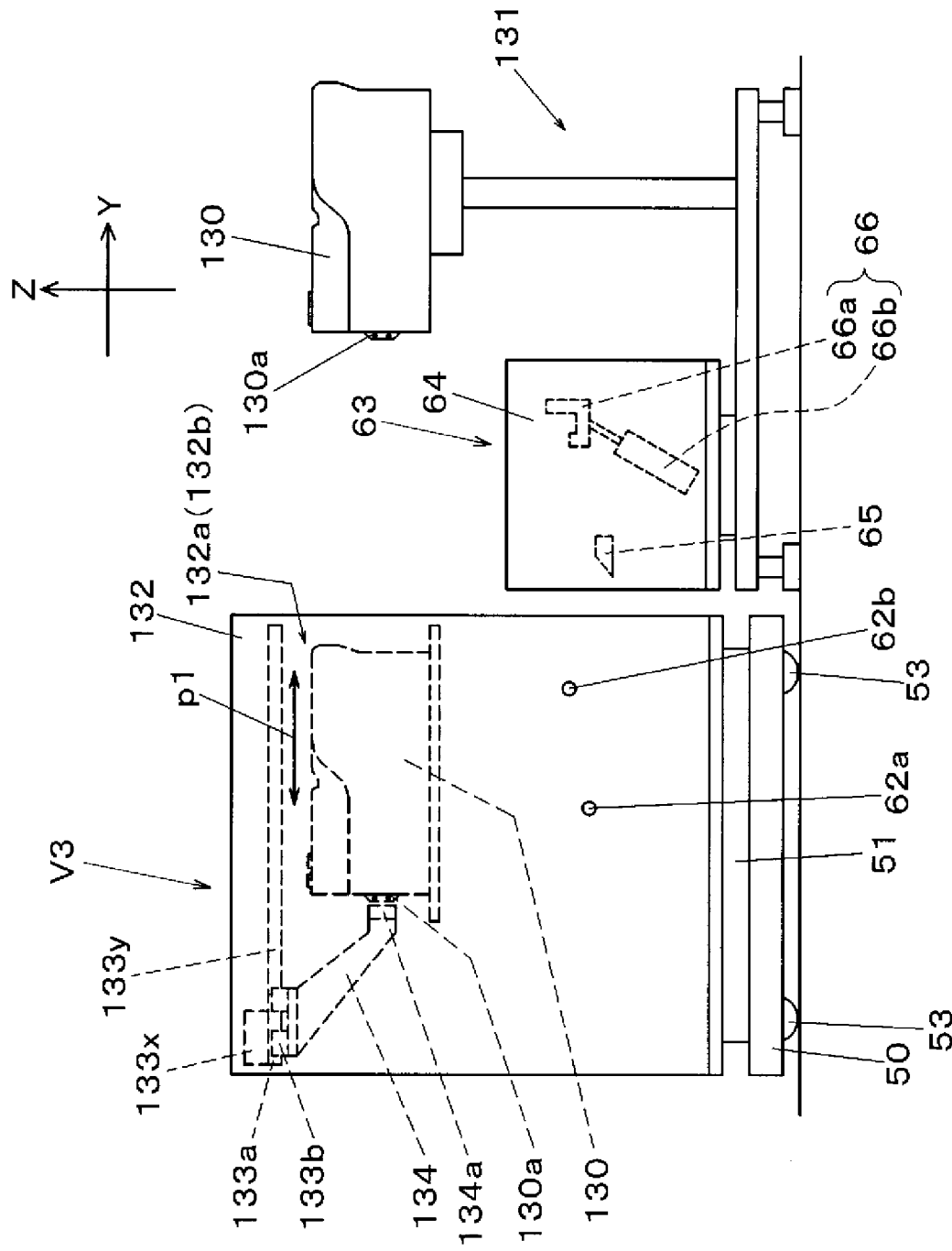
FIG. 24 is a view describing a configuration of a mobile component supply device and a carriage of a fourth example included in the component mounting system of the embodiment of the present invention.
Figure 25:
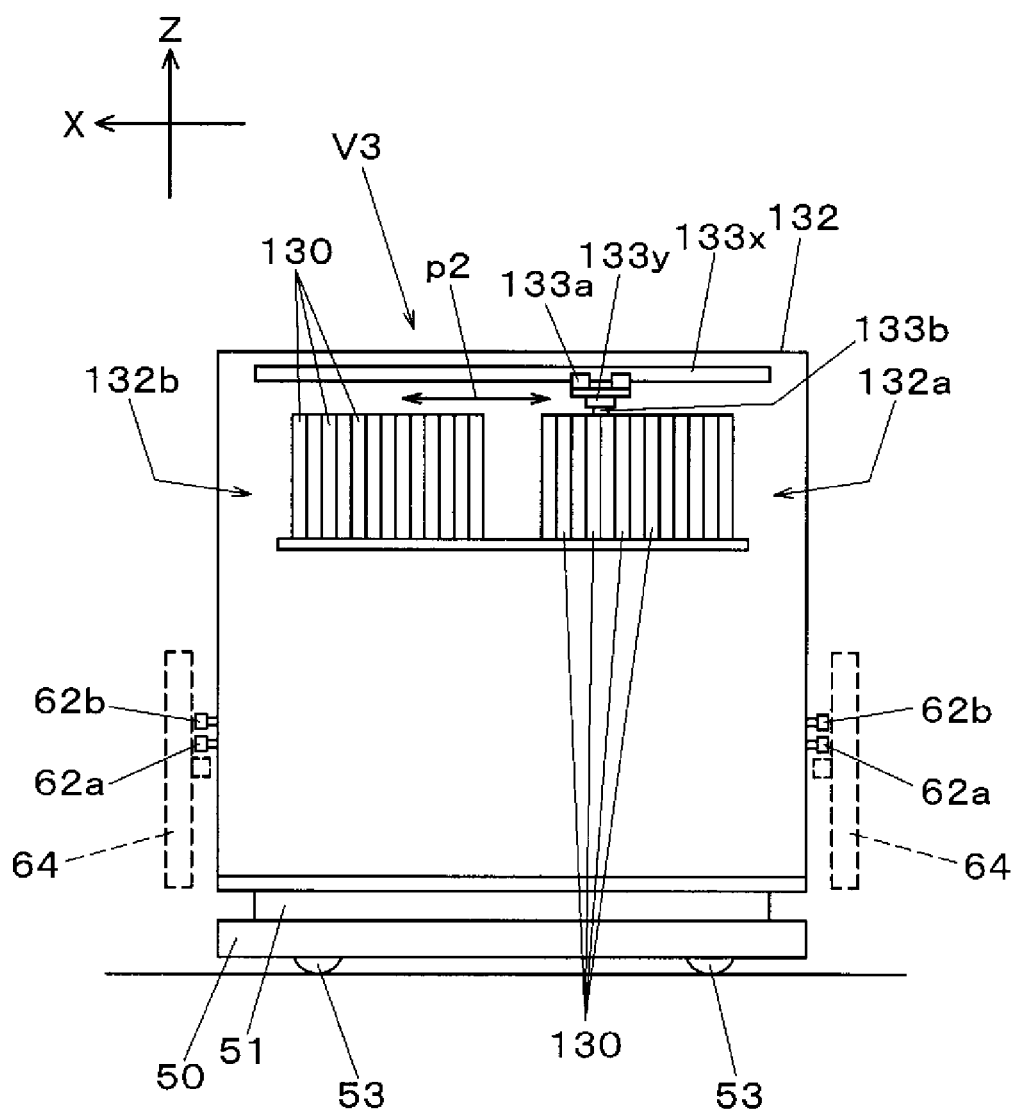
FIG. 25 is a view describing a configuration of the mobile component supply device of the fourth example included in the component mounting system of the embodiment of the present invention.

In FIG. 24 mobile component supply device V3 is configured by stacking carriage 50, supporter 51, and housing unit 132 from below. In FIG. 25, in housing unit 132, supply feeder housing shelves 132a housing built-in type tape feeder 130 to be supplied, and collection feeder housing shelves 132b housing collected built-in type tape feeder 130 are provided side by side in the X-direction (travelling direction of mobile component supply device V3). In the outer walls of housing unit 132 in the X-direction, there are respectively provided coupling roller 62a and coupling hook 62b (also refer to FIG. 25).

In FIG. 24 in the ceiling of housing unit 132, there is provided X-axis beam 133x along the X-direction. In X-axis beam 133x, there is provided X-axis slider 133a driven by the X-axis linear drive mechanism so as to move freely in the X-direction along X-axis beam 133x (arrow p2 in FIG. 25), X-axis beam 133x, X-axis slider 133a, and the X-axis linear drive mechanism configure the X-axis moving mechanism.

On the bottom X-axis slider 133a, there is provided Y-axis beam 133y along the Y-direction (direction orthogonal to the travelling direction of mobile component supply device V). In Y-axis beam 133y, there is provided Y-axis slider 133b driven by the linear drive mechanism so as to move freely in the Y-direction along Y-axis beam 133y (arrow p1). Y-axis beam 133y, Y-axis slider 133b, and the Y-axis linear drive mechanism configure the Y-axis moving mechanism.

In Y-axis slider 133b, transfer head 134 is installed. Transfer head 134 has grip device 134a. Grip device 134a grips gripper 130a of built-in type tape feeder 130 in carriage 131, supply feeder housing shelf 132a, and collection feeder housing shelf 132b.

The X-axis moving mechanism, the Y-axis moving mechanism, and transfer head 134 configure a feeder transfer mechanism. The feeder transfer mechanism grips supply target built-in type tape feeder 130 housed at a predetermined position in supply feeder housing shelf 132a, picks op built-in type tape feeder 130 out of housing unit 132, moves built-in type tape feeder 130 outside housing unit 132 in the X-direction and the Y-direction, and installs built-in type tape feeder 130 in carriage 131. In addition, the feeder transfer mechanism grips collect target built-in type tape feeder 130 installed in carriage 131, moves built-in type tape feeder 130 outside housing unit 132 in the X-direction and the Y-direction, and houses built-in type tape feeder 130 at a predetermined position in collection feeder housing shelf 132b.

Next, the operation in which mobile component supply device V3 supplies and collects built-in type tape feeder 130 will be described. In mobile component supply device V3, a step of housing supply target built-in type tape feeder 130 (supply cassette housing step (ST 3)), and a step of being coupled to coupler 63 (replacement preparing step (ST 4)) are respectively similar to those of the first example, and description will be omitted. When housing unit 132 is coupled to coupler 63, the feeder transfer mechanism transfer collect target built-in type tape feeder 130 from carriage 131 to collection feeder housing shelf 132b, houses collect target built-in type tape feeder 130 therein, transfers supply target built-in type tape feeder 130 from supply feeder housing shelf 132a to carriage 131, and installs supply target built-in type tape feeder 130 in carriage 131.

Figure 26:
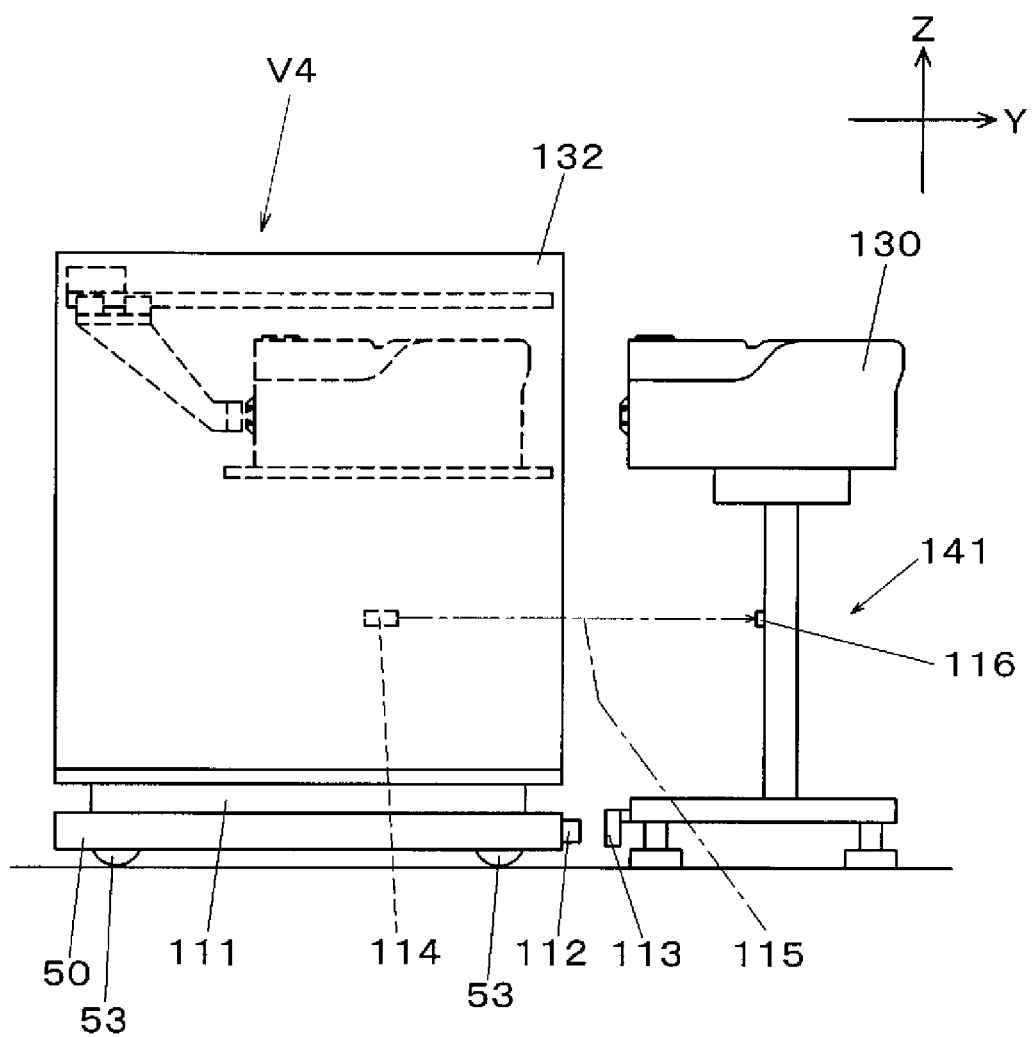
FIG. 26 is a view describing a configuration of a mobile component supply device and a carriage of a fifth example included in the component mounting system of the embodiment of the present invention.
Figure 27:
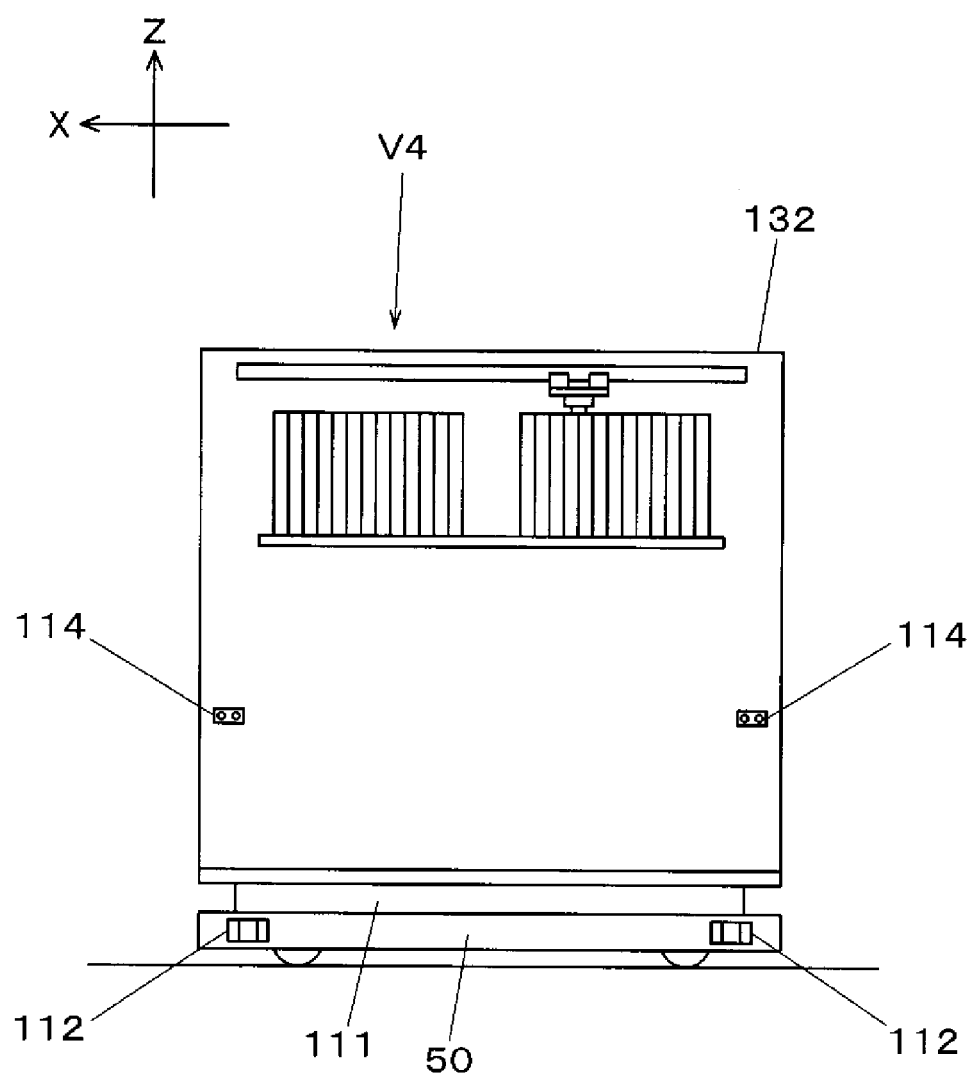
FIG. 27 is a view describing a configuration of the mobile component supply device of the fifth example included in the component mounting system of the embodiment of the present invention.

Next, with reference to FIGS. 26 and 27, a fifth example of mobile component supply device V4 and carriage 141 supplying and collecting built-in type tape feeder 130 will be described. Hereinafter, the same reference marks are applied to the same configurations as the second example illustrated in FIGS. 21 and 22 and the fourth example described above, and the detailed description will be omitted. On the top of carriage 141, plurality of built-in type tape feeders 130 are installed so as to be able to be attached and detached in parallel in the X-direction, Mobile component supply device V4 is configured by stacking carriage 50, support device 111, and housing unit 132 from below. Shade sensor 112 is provided in carriage 50, dog 113 is provided in carriage 141, laser displacement sensor 114 is provided in housing unit 132, and target 116 is provided in carriage. 141, respectively.

In replacement preparing step (ST 4), the operation in which mobile component supply device V4 performs positioning with respect to carriage 141 is similar to that of the second example (mobile component supply device V1 and carriage 110), and description will be omitted. After positioning is performed, the operation in which mobile component supply device V4 supplies and collects built-in type tape feeder 130 is similar to mobile component supply device V3 of the fourth example, and description will be omitted.

Each of the examples described above can be executed by being suitably combined together.

INDUSTRIAL APPLICABILITY

A component mounting system of the present invention has an effect of being able to reduce work of a worker in component replacing work and is useful in the component mounting field in which a component is mounted in a board.

REFERENCE MARKS IN THE DRAWINGS 1 component mounting system
2 communication network
3 management computer (component information manager)
3a wireless communicator
4 base
5 board transport mechanism
6 component supplier
7 tape feeder (component feeder, auto-loading feeder)
7a, 37 body
7b installer
7c tape transport path
7d tape insertion port
7e tape discharge port
8, 56y, 59y, 133y Y-axis beam
9, 56x, 59x, 133x X-axis beam
9a plate
10 mounting bead
10a suction unit
10b suction nozzle
11 component recognition camera
12 board recognition camera
13, 110, 131, 141 carriage
13a feeder base
14 carrier tape
14a feed hole
14b leading end
15 cassette holder (container holding device)
15a groove
16 component mounting worker
21 feeder controller
22 mounting controller
23 shutter mechanism
23a shutter
24 tape feed mechanism
24A first tape feed mechanism
24B second tape feed mechanism
25A, 25b sprocket
26A, 26B motor
27 biasing mechanism
28 retaining member
28a component pick-tip position
29 display panel
30 cover
31 core 32 core holder
33 tape extrusion mechanism
33a upper extrusion mechanism
33b lower extrusion, mechanism
33c tape guide path
34 pick-up port
35, 130a gripper
37a guide
37b insertion hole
38 extrusion member (carrier tape extrusion member)
8a surface
38b bottom surface
38c, 42b teeth
39 extrusion rod (carrier, tape extrusion member)
40, 44 spring
41 body
41a space
41b restricting surface
42 oscillation member
43 oscillation shaft
50 carriage (traveler)
51 supporter
52, 120, 132 housing unit
52a supply cassette housing unit (first area)
52b collection cassette housing unit (second area)
53 wheel
54 travel mechanism
55 supply controller
55a travel, controller
55b replacement controller
55c collection controller
56a, 59a, 133a X-axis slider
56b, 59b, 133b Y-axis slider
57 supply head
57a tape inserter
57b, 60a, 134a grip device
58 cassette supply mechanism
60 collecting head
61 cassette collection mechanism
62a coupling roller
62b coupling hook
63 coupler
64 guider
65 positioning block
66 coupling mechanism
66a coupling member
66b air cylinder
70 collection container
71 suction device (tape waste collector)
72 nozzle (tape waste collector)
73 keeping box
74A, 74B waste collection mechanism
76 tape waste accommodation box (tape waste collector)
77 accommodation box moving device (collecting device, tape waste collector)
77a gripper
78 accommodation box keeper
80 mounting storage unit
81, 86, 95, 97 communicator
82 management controller
82a component shortage manager
82b component supply plan former
82c component supply manager
82d collection timing calculator
83 management storage unit
83a component management information
83b component supply plan information
84 input unit
85 display
91 component storing controller
92 component storing storage unit
93 component storing worker
94 identification information reader
96 feeder storage twit
98 supply storage unit
98a supply component information
101 transparent cover
102 opaque cover
103 bar code
111 support device
112 shade sensor (position measurer)
114 laser displacement sensor (position measurer)
115 laser beam
116 target
121 supply reel housing shelf
121b collection reel housing shelf
122 articulated robot
123 leading end
130 built-in type tape feeder (component feeder)
132a supply feeder housing shelf
132b collection feeder housing shelf
134 transfer head
B board
C, C1 tape cassette (container)
D component
F floor
G discarder
Hu upward holding position (first holding position)
Hd downward holding position (second holding position)
Hm downward movement position
Hs supply position
L reel (container)
L1, L2, L3 component mounting line
M1 print device
M2 print inspection device
M3 to M6 component mounter
M7 mounting inspection device
M8 reflow device
Q insertion detection sensor (tape insertion detector)
R RF reader (information reader)
S component storing device (component storage)
T wireless communicator
U cassette collecting device
V, V1, V2, V3, V4 mobile component supply device
W tape waste

The invention claimed is:

1. A component mounting system comprising:
a component mounter that mounts a component in a board;
a component feeder that is placed in the component mounter and supplies the component; and
a mobile component supply device that holds at least one container storing a component, automatically moves, and supplies the component in the at least one container to the component feeder,
wherein the component mounter includes a container holding device having a first holding position for holding the at least one container, and a second holding position for holding the at least one container supplied prior to the container held at the first holding position,
wherein the mobile component supply device includes a container housing unit that collects the container held at the second holding position when the component stored in the container is consumed, wherein the component mounter includes a guide that moves the container held at the first holding position from the first holding position to the second holding position when the container housing unit collects the container held at the second holding position, wherein the guide is a groove formed in an inner wall of the container holding device, and wherein the groove is extended downwardly to allow the container to move downwardly due to gravity from a top of the container holding device to a bottom of the container holding device along the inner wall of the container holding device.

2. The component mounting system of claim 1, further comprising:

a component storage that stores the at least one container, wherein the mobile component supply device includes a container mover moving the at least one container between the container housing unit and the container holding device and between the container housing unit and the component storage.

3. The component mounting system of claim 1, wherein the container housing unit includes a first area housing a container to be supplied, and a second area housing a used container, and wherein the container mover moves the container to be supplied, from the first area to the first holding position and moves the used container from the second holding position to the second area.

4. The component mounting system of claim 2, wherein the mobile component supply device includes an information reader reading identification information applied to the at least one container.

5. The component mounting system of claim 3, wherein an information reader reading identification information applied to the at least one container is provided in the first area.

6. The component mounting system of claim 4, wherein the information reader reads the identification information at least any of before the at least one container is moved from the component storage to the container housing unit or after the at least one container is moved from the component storage to the container housing unit.

7. The component mounting system of claim 6, further comprising:

a component information manager that stores and manages the information of the component, wherein the mobile component supply device includes a wireless communicator being able to perform wireless communication with the component information manager, wherein the mobile component supply device transmits the identification information read through the information reader from the at least one container to the component information manager via the wireless communicator, and wherein the component information manager checks whether or not the at least one container is a container to be moved from the component storage to the container housing unit, based on the transmitted identification information.

8. The component mounting system of claim 7, wherein at least one of the mobile component supply device and the component information manager includes a data storage unit storing a position and the identification information of the at least one container housed in the container housing unit.

9. The component mounting system of claim 8, wherein the component storage is able to communicate with the component information manager, wherein the component information manager transmits information of a container to be supplied, to the component storage, and wherein the component storage positions the container to be supplied, at a position to which the container mover of the mobile component supply device is able to move, based on the information from the component information manager.

10. The component mounting system of claim 1, wherein the at least one container stores a carrier tape storing the component, wherein the component feeder is an auto-loading feeder and includes a tape insertion port into which a leading end of the carrier tape to be supplied is inserted, and wherein the mobile component supply device includes a tape inserter inserting and pushing the leading end of the carrier tape stored in the at least one container into the tape insertion port of the auto-loading feeder.

11. The component mounting system of claim 10, wherein the at least one container includes a carrier tape extrusion member in which one end engages with the carrier tape stored in the container and the other end protrudes out of the at least one container, and wherein the tape inserter pushes the carrier tape extrusion member into the at least one container so as to extrude the carrier tape from the at least one container.

12. The component mounting system of claim 1, further comprising:

a component information manager that stores and manages information of the component, wherein the mobile component supply device includes a wireless communicator being able to perform wireless communication with the component information manager, wherein the at least one container comprises a plurality of containers, the mobile component supply device transmits information indicating that housed one container of the plurality of containers is to be supplied, to the component information manager, wherein the component information manager transmits information instructing the component feeder which is a target to be supplied with the housed one container to accept supply of the component, wherein when the information instructing the component feeder to accept supply of the housed one container is received, the component feeder executes an operation for accepting the supply of the housed one container, wherein the at least one container stores a carrier tape storing the component, and wherein the component feeder includes a tape insertion port into which a leading end of the carrier tape to be supplied is inserted.

13. The component mounting system of claim 12, wherein the operation for accepting the supply is that a shutter provided in the tape insertion port is opened.

14. The component mounting system of claim 13, wherein the component feeder includes a tape insertion detector detecting that the carrier tape is normally inserted, and wherein when the tape insertion detector detects that the carrier tape is normally inserted, the tape insertion detector notifies the mobile component supply device of the detecting that the carrier tape is normally inserted and the tape inserter stops pushing the carrier tape.

15. The component mounting system of claim 2,
wherein the mobile component supply device further includes a supporter supporting the container housing unit from below so as to move freely in a horizontal direction and a vertical direction, and a traveller including the supporter on the top and moving or stopping automatically,
wherein the component mounter includes a coupler being coupled to the container housing unit and holding the container housing unit, and
wherein when the at least one container is moved by the container mover between the container housing unit and the container holding device, the traveller stops the mobile component supply device at a predetermined stop position with respect to the component mounter, and the coupler is coupled to the container housing unit and holds the container housing unit.

16. The component mounting system of claim 2,
wherein the mobile component supply device further includes a traveller including the container housing unit above and moving or stopping automatically, and a position measurer measuring a position with respect to the component mounter, and
wherein when the at least one container is moved by the container mover between the container housing unit and the container holding device, the traveller stops the mobile component supply device at a predetermined stop position with respect to the component mounter based on a measurement result of the position measurer.

17. The component mounting system of claim 16,
wherein when the mobile component supply device leaves the stop position, the container mover suspends movement of the at least one container, and
wherein the traveller makes a correction such that a position of the mobile component supply device becomes the stop position.

18. The component mounting system of claim 2,
wherein the container mover is an articulated robot,
wherein the articulated robot includes a recognizer recognizing a positioning mark provided in the component mounter, and
wherein the mobile component supply device recognizes a positional relationship with respect to the component mounter based on a recognition result of the recognizer.

19. The component mounting system of claim 1,
wherein the mobile component supply device includes a tape waste collector collecting tape waste resulted after the component is supplied.

20. The component mounting system of claim 19,
wherein the tape waste collector includes a suction device sucking the tape waste.

21. The component mounting system of claim 19,
wherein the tape waste collector is a collecting device collecting a tape waste accommodation box in which the tape waste is accumulated, in the mobile component supply device.

22. The component mounting system of claim 19, further comprising:
a collection timing calculator that calculates collection timing of the tape waste based on mounting information of the component mounter,
wherein the mobile component supply device collects the tape waste through the tape waste collector based on a calculation result of the collection timing calculator.

* * * * *